United States Patent
Pidutti et al.

(10) Patent No.: US 10,033,297 B2
(45) Date of Patent: Jul. 24, 2018

(54) RECTIFIER DEVICE

(71) Applicant: Infineon Technologies AG, Neubiberg (DE)

(72) Inventors: Albino Pidutti, Martignacco (IT); Damiano Gadler, Villach (AT); Ioannis Pachnis, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/379,007

(22) Filed: Dec. 14, 2016

(65) Prior Publication Data

US 2018/0166999 A1    Jun. 14, 2018

(51) Int. Cl.
*H02M 3/335* (2006.01)
*H02M 7/217* (2006.01)
*H01L 27/06* (2006.01)
*H01L 29/78* (2006.01)

(52) U.S. Cl.
CPC ........ *H02M 7/217* (2013.01); *H01L 27/0676* (2013.01); *H01L 29/7802* (2013.01)

(58) Field of Classification Search
CPC .. H02M 1/38; H02M 3/1588; H02M 3/33592; Y02B 70/1433; H02H 9/025; H01L 27/088
USPC .............. 323/222, 224, 266, 267, 271, 276, 323/282–288; 257/173, 229, 230, 328, 257/234, 342, 350
See application file for complete search history.

(56) References Cited

U.S. PATENT DOCUMENTS

| 5,748,463 | A | | 5/1998 | Tsutsui et al. | |
| 6,137,668 | A | * | 10/2000 | Feldtkeller | H03K 17/0822 361/103 |
| 6,269,011 | B1 | * | 7/2001 | Ohshima | H02H 3/087 323/908 |
| 6,768,623 | B1 | * | 7/2004 | Shen | H02H 3/087 361/31 |
| 7,842,568 | B2 | * | 11/2010 | Anderson | H01L 29/1083 257/229 |
| 7,876,076 | B2 | * | 1/2011 | Hasegawa | H02M 1/38 323/271 |
| 8,013,586 | B2 | * | 9/2011 | Tlaskal | H02M 1/38 323/282 |

(Continued)

OTHER PUBLICATIONS

U.S. Appl. No. 15/378,867, by Pidutti et al., filed Dec. 14, 2016.

(Continued)

*Primary Examiner* — Rajnikant Patel
(74) *Attorney, Agent, or Firm* — Shumaker & Sieffert, P.A.

(57) ABSTRACT

A rectifier is described herein. According to one example, the rectifier includes a semiconductor substrate and further includes an anode terminal and a cathode terminal connected by a load current path of a first MOS transistor and a diode that is connected parallel to a load current path. An alternating input voltage is operably applied between the anode terminal and the cathode terminal. Further, the rectifier includes a control circuit that is configured to switch the first MOS transistor on for an on-time period, during which the diode is forward biased. The first MOS transistor, the diode, and the control circuit are integrated in the semiconductor substrate.

38 Claims, 11 Drawing Sheets

(56) References Cited

U.S. PATENT DOCUMENTS

| | | | | |
|---|---|---|---|---|
| 8,125,244 B2* | 2/2012 | Baddela | ............... | H03K 17/18 |
| | | | | 326/33 |
| 9,035,626 B2* | 5/2015 | Stratakos | ............... | H02J 3/383 |
| | | | | 323/271 |
| 9,240,728 B2* | 1/2016 | Iorio | ............... | H02M 3/33576 |
| 9,281,680 B2* | 3/2016 | Nakayama | ........... | H02M 1/088 |
| 2011/0057630 A1 | 3/2011 | Saito et al. | | |

OTHER PUBLICATIONS

U.S. Appl. No. 15/378,945, by Pidutti et al., filed Dec. 14, 2016.
U.S. Appl. No. 15/379,055, by Pidutti et al., filed Dec. 14, 2016.
U.S. Appl. No. 15/631,767, filed by Damiano Gadler et al., filed Jun. 23, 2017.
U.S. Appl. No. 15/474,669, filed by Damiano Gadler et al., filed Mar. 30, 2017.

* cited by examiner

RECTIFIER DEVICE

TECHNICAL FIELD

The invention relates to the field of power supplies, in particular to rectifier circuits and devices and related methods and devices.

BACKGROUND

In the electric power grid electric electricity is usually distributed to customers in the form of alternating current (AC) for various reasons. Furthermore, alternators are used, for example, in automobiles to generate alternating current. In many applications, alternating current has to be converted into direct current (DC) in order to provide a DC supply for electronic circuits or other devices, which need a DC supply. This conversion process is referred to as rectification. The standard components used to build a rectifier are silicon diodes. Several types of rectifier exists. One common type is a single-phase full-wave rectifier that is usually built using four diodes connected in a bridge configuration (a so-called Graetz bridge). As a side note, it should be mentioned that the alternating voltage provided by the electric power grid (e.g. 120 or 230 volts) is usually transformed to lower voltages using transformers before being rectified. In the automotive sector, alternators usually generate multiple-phase output voltages, and a suitable three-phase full-wave rectifier may, for example, include six diodes. Furthermore, rectifier diodes may also be used, for example, in (DC/DC or AC/DC) switching converters.

Silicon diodes have a forward voltages of approximately 0.6 to 0.7 volts. Schottky- and germanium diodes have slightly lower forward voltages of approximately 0.3 volts. The forward voltage of a pn-junction (i.e. of a diode) depends on the semiconductor material and therefore can be regarded practically as a constant parameter (when disregarding temperature dependency) for a specific semiconductor manufacturing technology, which normally is based on silicon. That is, silicon diodes will always produce (at room temperature) a power dissipation of approximately 600 to 700 milliwatts per ampere load current. A diode bridge (bridge rectifier), which is composed of four diodes, thus produces a power dissipation of approximately 1.2 to 1.4 watts per ampere (RMS) of load current as two diodes are always forward biased in a diode bridge. Particularly for comparably low voltages (e.g. 5 to 15 volts) the power dissipation in the rectifier can be a significant portion of the total generated power.

To reduce power dissipation in rectifier devices, a technique referred to as active rectification may be used. Thereby, silicon diodes are replaced by power transistors such as power MOS field effect transistors (MOSFETs) or power bipolar junction transistors (BJTs), which have a comparably low on-resistance and thus may produce a significantly lower voltage drop as compared to simple silicon diodes. However, usually a relatively complex control circuit is needed to switch the transistor on and off synchronously to the alternating voltage.

SUMMARY

A rectifier is described herein. According to one example, the rectifier includes a semiconductor substrate and further includes an anode terminal and a cathode terminal connected by a load current path of a first MOS transistor and a diode that is connected parallel to a load current path. An alternating input voltage is operably applied between the anode terminal and the cathode terminal. Further, the rectifier includes a control circuit that is configured to switch the first MOS transistor on for an on-time period, during which the diode is forward biased. The first MOS transistor, the diode, and the control circuit are integrated in the semiconductor substrate.

Furthermore, a rectifier device is described herein. In accordance with one example, the rectifier device includes a plurality of transistor cells integrated in a semiconductor substrate, wherein the transistor cells connect a reference terminal and a substrate terminal of the rectifier device, and wherein a first transistor is composed of transistor cells included in the plurality of transistor cells. Further, the rectifier device includes a diode, which connects the reference terminal and the substrate terminal, and a control circuit that is configured to switch on the first transistor for an on-time period, during which the diode is forward biased.

Moreover, a method for operating a rectifier device is described therein; the rectifier device includes a semiconductor switch and a diode coupled in parallel between a first and a second terminal. In accordance with one example, the method includes detecting that the diode is forward biased, switching on the semiconductor switch upon detection that the diode is forward biased, detecting—while the diode is forward biased—that the voltage across the rectifier device between the first and the second terminal reaches a specific threshold voltage, and switching off the semiconductor switch upon detection that the voltage across the rectifier device has reached the specific threshold value.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings:

FIG. 2 illustrates a power MOSFET which can be used to replace a diode in a rectifier circuit, wherein, in the embodiments described herein, the power MOSFET is reverse conducting when switched on.

DETAILED DESCRIPTION

Figure 1:
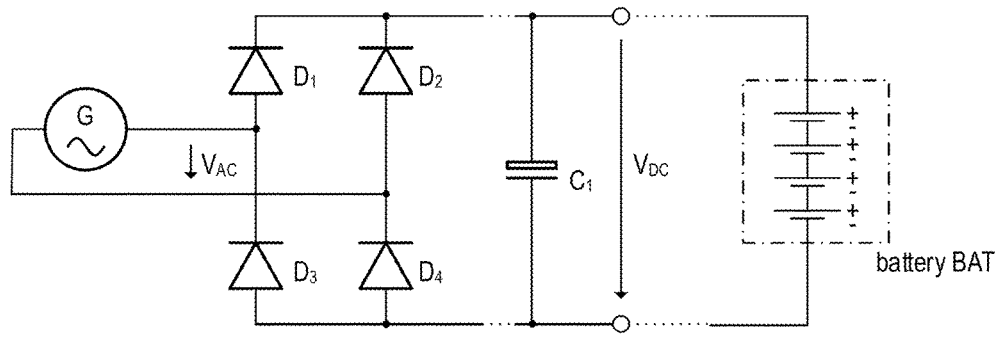
FIG. 1 illustrates, as an illustrative example, a single-phase full-wave rectifier circuit composed of four diodes.

As mentioned above, several types of rectifiers exists. FIG. 1 shows, as an illustrative example, a single-phase full-wave rectifier, which is built using four diodes $D_1$, $D_2$, $D_3$, $D_4$ connected in a bridge configuration (a so-called Graetz bridge or bridge rectifier). FIG. 1 also shows an AC voltage source G, which may represent, for example, the electric grid, the secondary side of a transformer, an AC generator such as an alternator used in an automobile, or any other common AC voltage source. The voltage source G provides an alternating voltage $V_{AC}$ supplied to the bridge rectifier. A capacitor $C_1$ may be connected to the output of the bridge rectifier to reduce the ripple of the DC output voltage $V_{DC}$. In the example of FIG. 1, an automotive battery BAT is coupled to the bridge rectifier so that the battery can be charged by the generator G. Silicon diodes usually have a forward voltage of approximately 0.6 to 0.7 volts, and therefore may cause significant power dissipation. To reduce the power dissipation, a silicon diode may be replaced by a rectifier device including a controllable semiconductor switch. In the example illustrated in FIG. 2, the rectifier device 10 includes a power MOS transistor $M_P$, which has an intrinsic diode $D_R$ (body diode) coupled in parallel to the load current path (drain-source current path) of the power MOS transistor $M_P$. Anode and cathode of the rectifier device 10 correspond to anode and cathode of the intrinsic diode and are labelled A and K, respectively. In the examples described herein, the power MOS transistor is a MOSFET with the intrinsic diode being the MOSFETs body diode. In this context, however, an IGBT (which is also switched on and off by a MOS gate) may also be regarded as a MOS transistor, wherein the IGBT may have a reverse diode integrated in the same semiconductor die as the IGBT.

Unlike in known active rectifier circuits (also referred to as "synchronous rectifiers"), the MOSFET $M_P$ is operated in a reverse conducting mode. In essence, a standard rectifier diode (as used for example in the bridge rectifier of FIG. 1) is replaced by the body diode of a power MOSFET, which can be bypassed by the MOS channel of the MOSFET, when the MOSFET is switched on. That is. the MOSFET is switched on (which makes the MOS channel conductive), when the body diode is forward biased, thus bypassing the current path through the body diode. When the diode $D_R$ is reverse biased the MOSFET $M_P$ is always off. In the example depicted in FIG. 2, the rectifier device 10 has only two terminals, a first terminal A (anode terminal, connected to the anode of the body diode $D_R$) and a second terminal K (cathode terminal, connected to the cathode of the body diode $D_R$). As will be explained later, the control circuit used for switching the MOSFET $M_P$ on and off may be integrated in the same semiconductor die as the MOSFET $M_P$, and the internal supply of the integrated control circuit may be internally generated from the AC voltage applied at the two terminals A and K.

Figure 2:
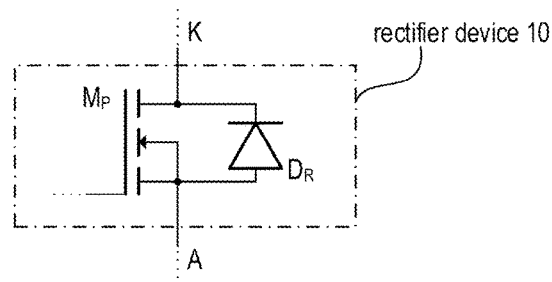
Figure 3:
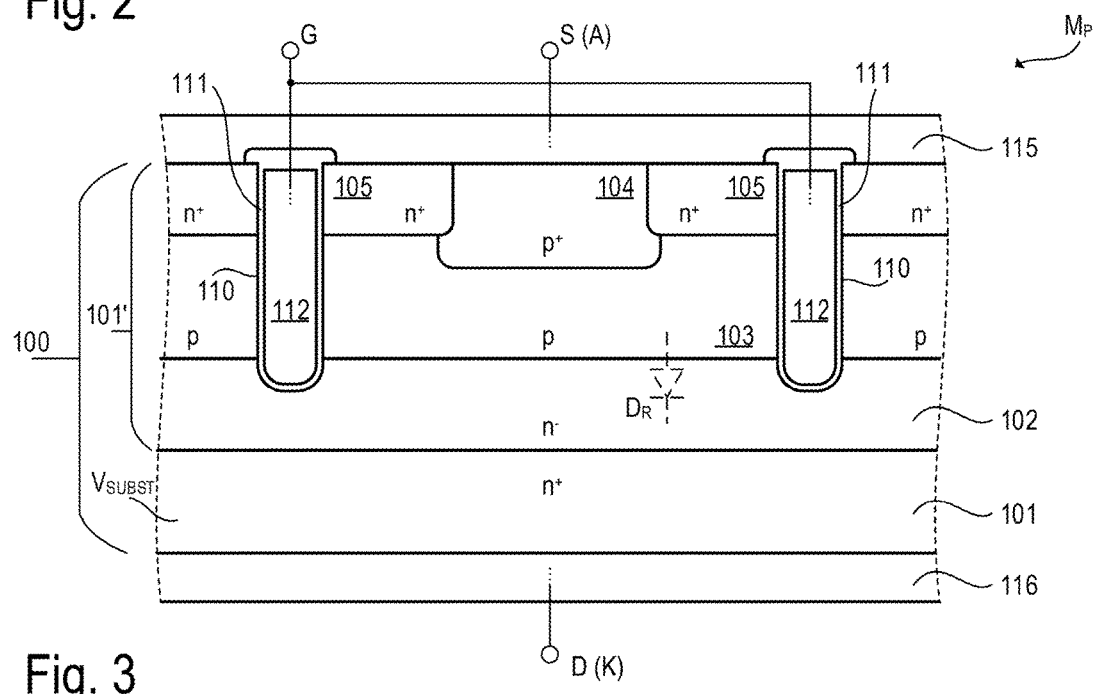
FIG. 3 is a cross-sectional view of a semiconductor body illustrating exemplary implementation of the power MOSFET of FIG. 2.

FIG. 3 illustrates one exemplary implementation of the power MOSFET $M_P$ of FIG. 2 in a silicon substrate. In the present example, the MOSFET is implemented using a vertical transistor structure composed of a plurality of transistors cells. The term "vertical" is commonly used in the context of power transistors and refers to the direction of the load current path (MOS channel), which extends vertically with respect to a horizontal plane defined by the bottom plane of the semiconductor substrate. The term "vertical" can thus be used to discriminate vertical transistors from planar transistors, in which the load current path (MOS channel) extends parallel to the horizontal plane. In the present example, the vertical MOS transistor is implemented as a so-called trench transistor, which has its gate electrodes arranged in trenches formed in the silicon body. However, other types of vertical power transistors or other types of transistors may be used.

In the example of FIG. 3, the semiconductor body 100 is essentially formed by a semiconductor substrate 101 (wafer), on which a (e.g. monocrystalline) semiconductor layer 101' is deposited using epitaxial growth. The semiconductor substrate 101 and the semiconductor layer 101' may be doped with dopants of a first doping type, e.g. n-type dopants, wherein the concentration of dopants may be much lower in the semiconductor layer 101' (therefore labelled n⁻) as compared to the highly doped substrate 101 (labelled n⁺). Trenches 110 are formed in the semiconductor layer by an anisotropic etching process. The trenches 110 extend—from the top surface of the semiconductor body 100—vertically into the semiconductor body 100 and are filled with conductive material (e.g. highly doped polycrystalline silicon) to form gate electrodes 112 within the trenches 110. The gate electrodes 112 are isolated from the surrounding semiconductor body 100 by an oxide layer 111, which is disposed on the inner surfaces of the trenches 110 before filling them with the mentioned conductive material.

An upper portion of the semiconductor layer 101' is doped with dopants of a second doping type, e.g. p-type dopants, e.g. using a first doping process (e.g. diffusion process of dopants or ion implantation). The resulting p-doped region is usually referred to as body region 103, whereas the remaining n-doped portion of the semiconductor layer 101' (directly adjoining the substrate 101) forms the so-called drift region 102 of the MOS transistor. As the trenches 110 extend down to the drift region 102, the body region 102 is segmented into a plurality in body regions associated with a respective plurality of transistor cells.

A second doping process (e.g. diffusion process of dopants or ion implantation) is used to form source regions 105. Therefore, the MOSFET $M_P$ is also referred to as DMOS (double-diffused metal-oxide-semiconductor) transistor. The source regions are doped with dopants of the same type as the substrate 101 (e.g. n-type dopants). The concentration of dopants may be comparably high (therefore labelled n⁺), but is not necessarily equal to the concentration of dopants in the substrate 101. The source regions 105 extend vertically into the semiconductor body starting from the top surface of the semiconductor body and adjoining the trenches 112. Body contact regions 104, which are doped with dopants of the same type as the body regions 103, may be formed between neighboring trenches 110 in order to allow to electrically contact the body regions 103 at the top surface of the semiconductor body 100. The source regions 105 and the body contact regions 104 are electrically contacted at the top surface of the semiconductor body 100 by the conductive layer 115 (e.g. metal layer) that forms the source electrode S of the power MOSFET (DMOS transistor). Thereby the individual transistors cells are electrically connected in parallel. The gate electrodes 112 in the trenches 110 have to be isolated from the conductive layer 115 and are also connected to each other, e.g. at the end of the trenches 110 (not visible in FIG. 3). The drain electrode D is formed by another conductive layer 116 at the bottom surface of the semiconductor body 100.

The body diode $D_R$ (see also FIG. 3) of the MOSFET is also shown in the cross-sectional view of FIG. 3. It is formed by the p-n junctions at the transition between the body regions 103 (in each transistor cell) and the drift region 102. The source electrode S (which is electrically connected to the source and body contact regions) is therefore also the anode of the diode $D_R$, and the drain electrode D is also the cathode of the diode $D_R$. A transistor designed according to the example of FIG. 3 or similar transistor designs are as such known (sometimes referred to as DMOS transistor) and thus not further explained in more detail.

Figure 4:
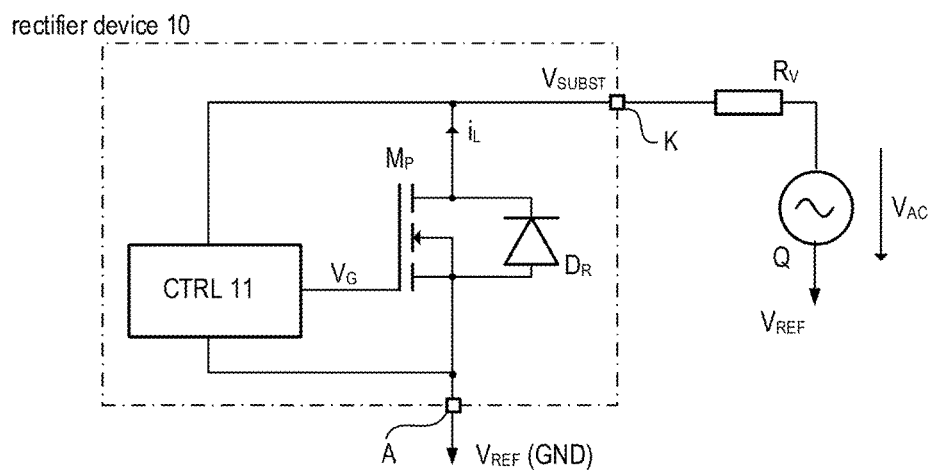
FIG. 4 is a circuit diagram illustrating the power MOSFET of FIG. 2 and a control circuit that is configured to actively switch the MOSFET on when the body diode becomes forward biased.

What should be mentioned at this point is that the MOS transistor $M_P$ is not the only component integrated in the substrate. All other circuitry needed for controlling the switching operation of the MOS transistor $M_P$ is also integrated in the same semiconductor body 100. The embodiments described herein may be designed as two-terminal rectifier devices (anode or reference terminal A and cathode or substrate terminal K), which have only two external pins and behave essentially like diodes. Unlike a normal diode, the rectifier devices described herein may be designed to have a very low forward voltage as the low-resistive MOS channel bypasses the current path through the body diode $D_R$ while the body diode is forward biased. In the following, the potential at the first terminal A (anode terminal, corresponds to the source electrode of the power MOSFET $M_P$) is denoted as reference voltage $V_{REF}$, whereas the voltage at the second terminal K (cathode terminal, corresponds to the drain electrode of the power MOSFET $M_P$) is denoted as substrate voltage $V_{SUBST}$ (voltage present in the substrate 101, see FIG. 3). FIG. 4 illustrates the rectifier device 10 of FIG. 2 in more detail. Accordingly, the rectifier device includes the MOSFET/DMOS transistor $M_P$ (include the intrinsic reverse diode $D_R$, see FIG. 2) and a control circuit 11 connected to a gate terminal of the MOSFET $M_P$. As explained above, the MOSFET $M_P$ and its intrinsic body diode $D_R$—and also the control circuit 11—are connected between the first and the second terminals A and K, respectively. The electric potential $V_{REF}$ at the first terminal (anode) can be defined as zero volts (0 V) and can thus be regarded as reference or ground potential for all circuitry integrated in the semiconductor body 100. With respect to the reference potential $V_{REF}$, the substrate voltage $V_{SUBST}$ may vary from negative values of (at room temperature) approximately −0.7 volts minimum (i.e. the negative forward voltage of the body diode $D_R$) to a positive peak value $V_{AC\_MAX}$ of an alternating input voltage $V_{AC}$ applied between the two terminals A and K. In the example of FIG. 4, the rectifier device 10 is supplied by an AC source Q via a resistor $R_V$. Supplying the rectifier device 10 has to be regarded as a merely hypothetical example, which is used to explain the function of the rectifier device.

Figure 5:
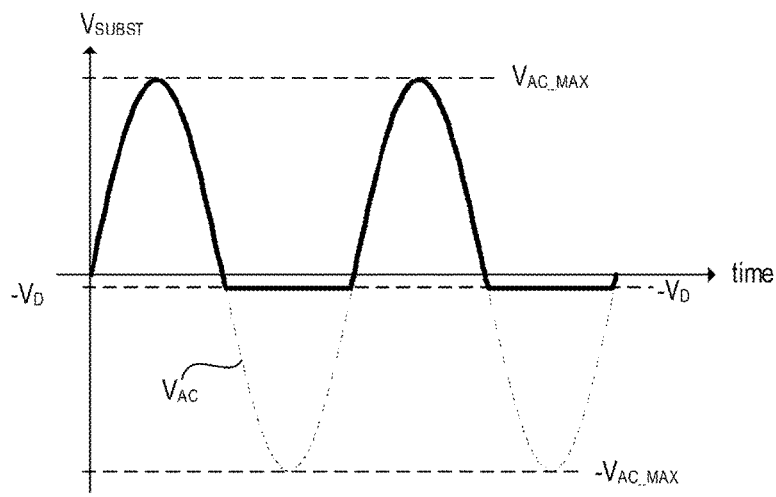
FIG. 5 is a timing diagram illustrating the voltage across the body diode of the MOSFET of FIG. 4, when the MOSFET is connected to a load and not actively switched on while being supplied with an alternating voltage.

FIG. 5 is a timing diagram illustrating the waveform of the substrate voltage $V_{SUBST}$ with respect to the reference potential $V_{REF}$ for the hypothetic case, in which the MOSFET $M_P$ included in the rectifier device 10 is never switched on and, therefore, the load current $i_L$ can only pass the rectifier device 10 via the body diode $D_R$. In this example it is further assumed that an alternating input voltage $V_{AC}$ is applied to a series circuit of the rectifier device 10 and a load (see FIG. 4, resistor $R_V$). Without loss of generality, the reference potential $V_{REF}$ may be defined as 0 V. While the body diode $D_R$ is reverse biased ($V_{SUBST}$>0 V), the substrate voltage $V_{SUBST}$ follows the alternating input voltage $V_{AC}$ and the load current is approximately zero (diode $D_R$ is blocking). While the body diode $D_R$ is forward biased ($V_{SUBST}$<0V), the substrate voltage $V_{SUBST}$ follows the alternating input voltage $V_{AC}$ as long as the alternating input voltage $V_{AC}$ is higher than the negative forward voltage −$V_D$ of the body diode $D_R$ (e.g. $V_{AC}$>−0.6V). However, when the alternating input voltage $V_{AC}$ becomes lower than the negative forward voltage −$V_D$ of the body diode $D_R$ (e.g., $V_{AC}$<−0.6V), the substrate voltage will be approximately limited to the negative forward voltage −$V_D$ of the body diode $D_R$ (e.g., $V_{SUBST}$≈−0.6V), the diode $D_R$ is conductive, and the difference between the (negative) substrate voltage and the alternating input voltage $V_{AC}$ is the voltage drop across the load. The load current $i_L$ actually passing through the rectifier device 10 (while $V_{AC}$<−$V_D$) depends on the load.

As mentioned above, a voltage drop across the rectifier device 10 of approximately 600 to 700 mV (at room temperature) may cause a significant power dissipation. To reduce the substrate voltage $V_{SUBST}$ while the body diode $D_R$ is forward biased, the MOS transistor $M_P$ can be switched on to make the MOS channel of the MOS transistor $M_P$ conductive. In this case, the body diode $D_R$ is bypassed via the low-ohmic current path provided by the MOS channel. However, in the time period, in which the body diode $D_R$ is reverse biased (i.e. blocking), the MOS transistor should remain switched off. The logic circuit controlling the switching operation of the MOS transistor $M_P$ is included in the control circuit 11 (see FIG. 4).

As shown in FIG. 4, the control circuit 11 is coupled between the two terminals A and K, at which the alternating input voltage is applied (see FIG. 5). However, some circuit components in the control circuit 11 need a DC supply voltage in order to operate properly. Therefore, the control circuit 11 includes at least one supply circuit, which provides an internal supply voltage $V_S$ for supplying various other circuit components of the control circuit 11. Before explaining exemplary implementations of the control circuit 11 and its function in more detail, two exemplary implementations of supply circuits are explained with reference to FIG. 6.

Figure 6:
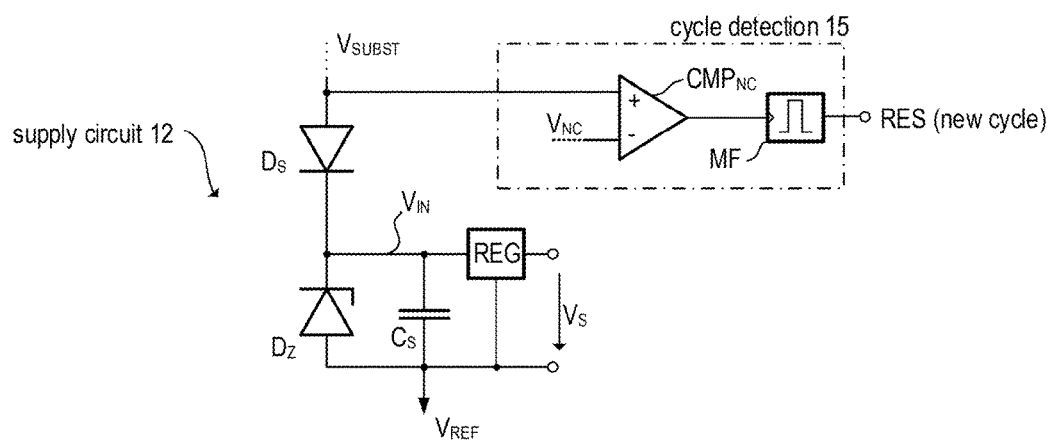
FIG. 6 is a circuit diagram illustrating an exemplary supply circuit, which may be included in the control circuit to supply the control logic used to switch the MOSFET of FIG. 4 on and off.

The exemplary supply circuit 12 illustrated in FIG. 6 is coupled between the first (anode) terminal A (reference potential $V_{REF}$) and the second (cathode) terminal K (substrate voltage $V_{SUBST}$), which are connected to the source and drain of the MOSFET $M_P$, respectively. A series circuit composed of a diode $D_S$ and a Zener diode $D_Z$ is electrically connected between the substrate (being at substrate voltage $V_{SUBST}$) and the source electrode of the MOSFET $M_P$ (being at reference potential $V_{REF}$). A buffer capacitor $C_S$ is connected parallel to the Zener diode $D_Z$ as shown in FIG. 6. The capacitor $C_S$ is charged via the diode $D_S$ when the level of the substrate voltage $V_{SUBST}$ is higher than the sum of the voltage $V_{IN}$ across the capacitor $C_S$ and the forward voltage of the diode $D_S$. The Zener diode $D_Z$ limits the capacitor voltage $V_{IN}$ across the capacitor $C_S$ to a maximum value, which is determined by the Zener voltage of the Zener diode $D_Z$. Furthermore, the diode $D_S$ prevents the discharging of the capacitor $C_S$ via the substrate when the substrate voltage $V_{SUBST}$ falls to values lower than the capacitor voltage $V_{IN}$. The capacitor voltage $V_{IN}$ may be supplied as input voltage to a voltage regulator device REG, and the input voltage $V_{IN}$ is buffered by the capacitor $C_S$ while the substrate voltage $V_{SUBST}$ is low. The regulated output voltage of the voltage regulator REG is denoted as $V_S$. The regulated output voltage $V_S$ may be rewarded as internal supply voltage that is used to supply any circuitry (such as logic circuits) integrated in the rectifier device 10.

Also shown in FIG. 6 but not part of the supply circuit 12 is a cycle detection circuit 15 that essentially includes a comparator $CMP_{NC}$, which is configured to signal at its output a new cycle of the substrate voltage $V_{SUBST}$. The comparator $CMP_{NC}$ may be supplied by the internal supply voltage $V_S$. In the present example, the comparator compares the substrate voltage $V_{SUBST}$ with the threshold voltage $V_{NC}$, which may be equal to the reference voltage $V_{REF}$ or may be a small positive value in the range of a few millivolts. The threshold voltage $V_{NC}$ is applied to the inverting input of the comparator $CMP_{NC}$ and the substrate voltage $V_{SUBST}$ is applied to the non-inverting input of the comparator $CMP_{NC}$. Thus, the comparator $CMP_{NC}$ generates a rising edge at its output when the substrate voltage $V_{SUBST}$ rises above the threshold voltage $V_{NC}$. This rising edge may trigger a mono-flop MF, which is connected to the output of the comparator $CMP_{NC}$ and generates a reset pulse of a defined pulse length in each cycle of the alternating substrate voltage $V_{SUBST}$.

It is noted, that the circuit of FIG. 6 has to be regarded as an illustrative example and may also be implemented in various alternative ways. For example, the Zener diode $D_Z$ may be replaced by a any clamping circuit configured to limit the capacitor voltage to a desired maximum. Dependent on the application the Zener diode may be omitted. The capacitor $C_S$ may be replaced by any circuit (e.g. series or parallel circuit of several capacitors) providing a sufficient capacitance to be able to buffer the input voltage $V_{IN}$ while the substrate voltage is too low to charge the capacitor $C_S$. In some implementations, the voltage regulator REG may be substituted by other circuitry that provides a similar function. If the capacitance of the capacitor $C_S$ is high enough to ensure an acceptably low ripple, the regulator REG may be also omitted. As mentioned, various modifications and enhancements of the basic example of FIG. 6 may be considered. For example, a source follower may be connected between the cathode of diode $D_S$ and the voltage regulator REG, wherein the gate of the source follower is connected to a substantially constant voltage (e.g. generated using a Zener diode). This would limit the capacitor voltage to a desired maximum and reduce current consumption.

Figure 7A:
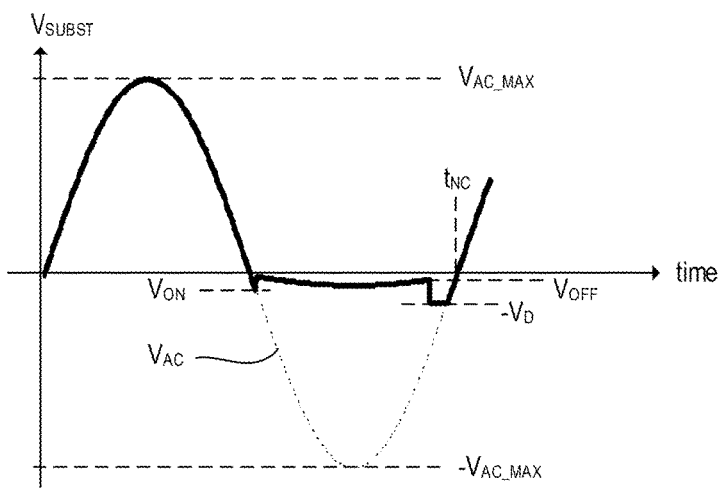
FIGS. 7A and 7B are timing diagrams illustrating the switching of the MOSFET of FIG. 4, when supplied with an alternating voltage.
Figure 7B:
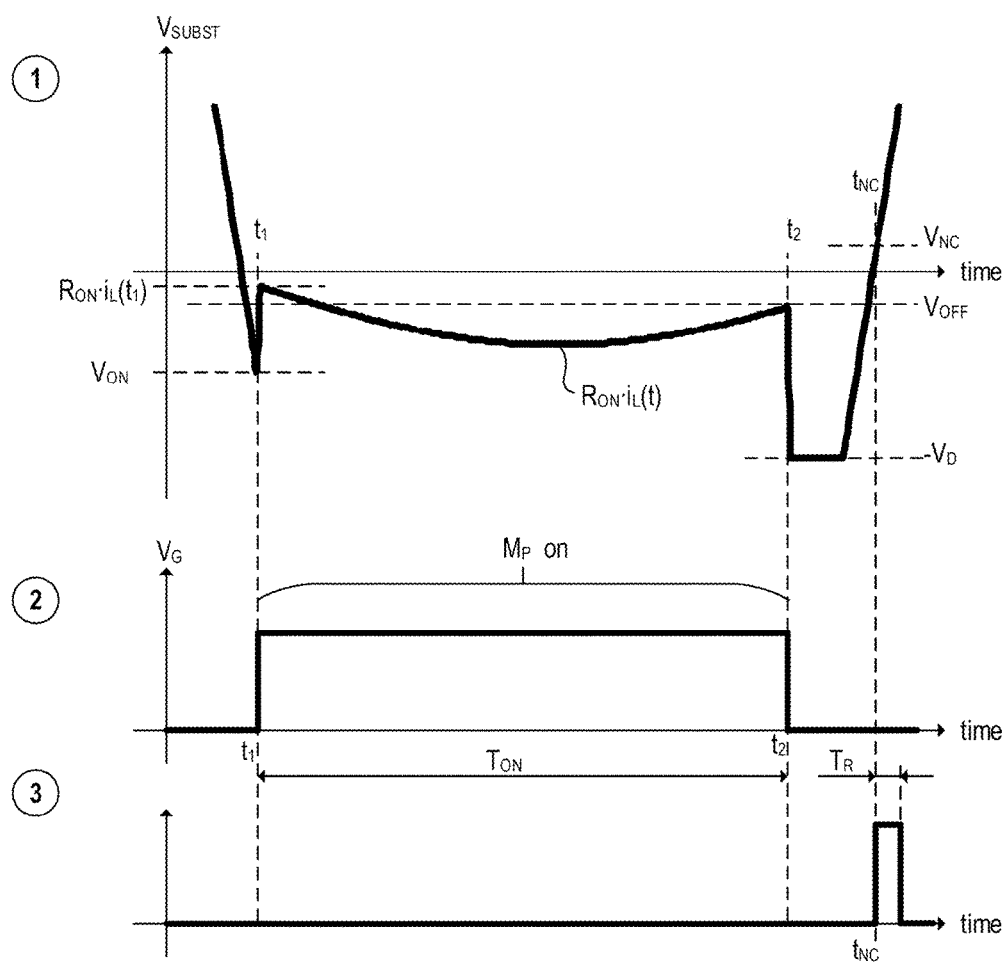

FIG. 7A is a timing diagram illustrating the function of one exemplary embodiment of the rectifier device implemented according to the basic example of FIG. 4. In particular, the switching on and switching off of the MOS transistor $M_P$ is illustrated. The diagram of FIG. 7A is essentially the same as the diagram of FIG. 5 except that, in the current example, power MOS transistor $M_P$ is switched on, when the intrinsic body diode $D_R$ is forward biased in order to bypass the body diode via the activated MOS channel. The bypassing of the body diode $D_R$ results in a voltage drop across the rectifier device 10, which is significantly lower than the forward voltage of a normal diode. The first diagram of FIG. 7B illustrates a magnified detail of the waveform shown in FIG. 7A. FIG. 7A shows a full cycle of the substrate voltage $V_{SUBST}$, whereas the first diagram of FIG. 7B only shows approximately the second half of the cycle, during which the substrate voltage $V_{SUBST}$ is negative. The second diagram illustrates a simplified waveform of the gate voltage applied to the MOS transistor $M_P$ to switch it on and off. The third diagram of FIG. 7B illustrates the reset signal RES including the reset pulses, which may be generated by the cycle detection circuit 15 shown in FIG. 6. As can be seen in FIGS. 7A and 7B, the MOS transistor $M_P$ is switched on, when the control circuit 11 detects that the substrate voltage $V_{SUBST}$ is negative (i.e. the diode $D_R$ is forward biased). To determine the time instants for switching the MOS transistor $M_P$ on and off (i.e. begin and end of the on-time period $T_{ON}$ of MOS transistor $M_P$) negative threshold voltages $V_{ON}$ and $V_{OFF}$ may be used as explained below. Accordingly, the MOS transistor $M_P$ is switched on, when the substrates voltage $V_{SUBST}$ reaches or falls below the first threshold $V_{ON}$. In the present example, the condition $V_{SUBST}=V_{ON}$ is fulfilled at time $t_1$ and the gate voltage $V_G$ (see second diagram of FIG. 7B) is set to a high level to switch the MOS transistor $M_P$ on. When the substrate voltage $V_{SUBST}$ reaches or exceeds the second threshold $V_{OFF}$ at the end of a cycle, the MOS transistor $M_P$ is switched off again. In the present example, the condition $V_{SUBST}=V_{OFF}$ is fulfilled at time $t_2$ and the gate voltage $V_G$ (see bottom diagram of FIG. 7B) is set to a low level to switch the MOS transistor $M_P$ off. When the MOS transistor $M_P$ is switched off at time $t_2$, the substrate voltage $V_{SUBST}$ may abruptly fall to $-V_D$ before it again rises to positive values at the beginning of the next cycle (reset pulse at time instant $t_{NC}$).

While the MOS transistor $M_P$ is switched on, the substrate voltage $V_{SUBST}$ equals $R_{ON} \cdot i_L$, wherein $R_{ON}$ is the on-resistance of the activated MOS channel. In the present example only two threshold values are used to switch the MOS transistor $M_P$ on and off, respectively. However, two or more threshold values may be used for the switch-on and/or the switch-off. In this case the power MOSFET is switched on/off gradually by subsequently switching on/off two or more groups of transistor cells of the power MOSFET. A more detailed example of a rectifier device, in which the power MOSFET is switched off in two steps is explained later with regard to FIG. 12.

Referring back to FIG. 7A, both the first threshold $V_{ON}$ and the second threshold $V_{OFF}$ are negative (note that the reference voltage $V_{REF}$ is defined as zero), but higher than the negative forward voltage $-V_D$ of the body diode $D_R$ of the MOS transistor $M_P$. Furthermore, the second threshold $V_{OFF}$ is higher than the first threshold $V_{ON}$. That is, the condition $-V_D < V_{ON} < V_{OFF} < 0$ is fulfilled in the present example, e.g. $V_{ON} = -250$ mV and $V_{OFF} = -50$ mV, while $-V_D \approx -600$ mV. As can be seen in FIG. 7B, the MOS transistor should only switch on once in each cycle when the condition $V_{SUBST} = V_{ON}$ is met for the first time. When the condition is met again in the same cycle, a second switch-on of the MOS transistor $M_P$ should be prevented (e.g. at time instant $t_2$, see first diagram of FIG. 7A). Similarly, the MOS transistor $M_P$ should be switched off when the condition $V_{SUBST} = V_{OFF}$ is me at the end of a cycle. If this condition is met earlier during a cycle (e.g. shortly after time $t_1$, if $R_{ON} \cdot i_L(t_1) > V_{OFF}$), an early switch-off of the MOS transistor should be prevented. In order to avoid an undesired early switch-off of the MOS transistor, the control circuit may include a timer that prevents a switch-off for a specific time span. One exemplary implementation of control logic, which may be included the control circuit 11, is described below with reference to FIG. 8.

Figure 8:
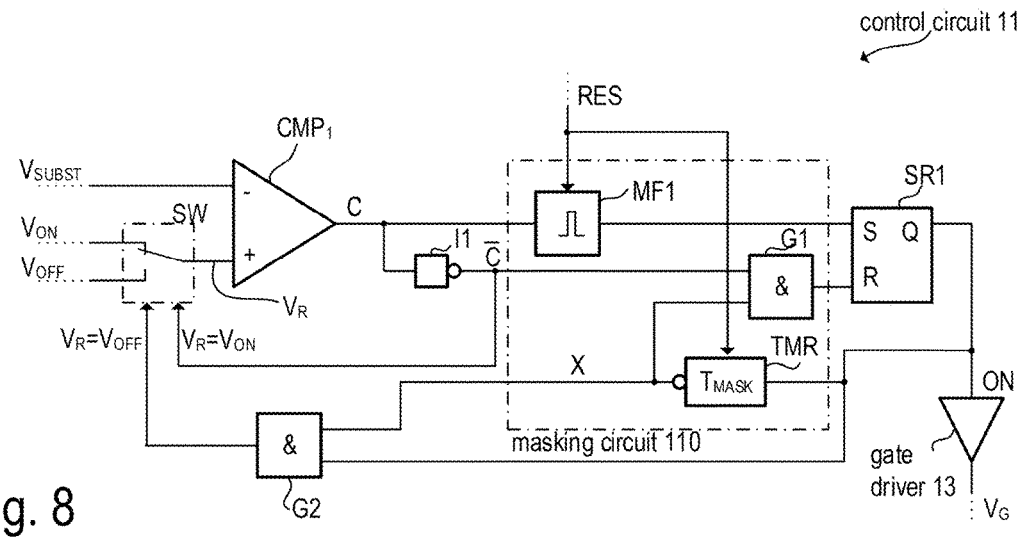
FIG. 8 is a block diagram illustrating one exemplary control logic for switching the MOSFET of FIG. 4 on and off as shown in the timing diagrams of FIGS. 7A and 7B.

FIG. 8 is a block diagram illustrating one exemplary implementation of a control logic for the control circuit 11 (see FIG. 4) which is designed to switch the MOS transistor $M_P$ on and off as illustrated in the timing diagrams of FIGS. 7A and 7B. Various circuit components used in the circuit of FIG. 8 may be supplied by a supply circuit 12 as shown, for example, in FIG. 6 (internal supply voltage $V_S$). In the present example, the control logic includes a comparator $CMP_1$ that receives the substrate voltage $V_{SUBST}$ at a first input (e.g. inverting input) and a threshold voltage $V_R$ at a second input (e.g. non-inverting input). The substrate voltage $V_{SUBST}$ and the threshold voltage $V_R$ are compared by the comparator $CMP_1$, which generates a binary comparator output signal C (high/low logic signal). An inverter I1 is connected to the comparator output and generates an inverted comparator output signal $\overline{C}$. A level transition (dependent on the implementation from a low level to a high level or vice versa) occurs in the comparator output signal C when the substrate voltage $V_{SUBST}$ reaches the threshold voltage $V_R$. In the present example, the comparator $CMP_1$ generates a high level when the substrate voltage $V_{SUBST}$ is below the threshold voltage $V_R$.

To implement the switching scheme shown in FIG. 7B, the threshold voltage $V_R$ may be switched from a first value $V_{ON}$ to a second value $V_{OFF}$ (and vice versa) using, for example, an electronic switch SW. In the present example, the electronic switch SW is configured to apply either the first threshold voltage $V_{ON}$ or the second voltage $V_{OFF}$ (as reference voltage $V_R$) to the second comparator input. The comparator output is coupled to the set and reset inputs of a SR flip-flop SR1 via a masking circuit 110. The masking circuit 110 is designed to prevent a multiple switch-on and an undesired early switch-off of the power MOSFET $M_P$. The SR flip-flop SR1 is activated, when the comparator output signal C indicates (e.g., by a specific level or a level transition) that the substrate voltage $V_{SUBST}$ has reached the threshold voltage $V_R=V_{ON}$. The SR flip-flop SR1 is reset, when the comparator output signal C indicates that the substrate voltage $V_{SUBST}$ has reached the threshold voltage $V_R=V_{OFF}$, wherein the reference voltage $V_R$ is changed from $V_{ON}$ to $V_{OFF}$ some time after the SR flip-flop SR1 has been activated and changed back from $V_{OFF}$ to $V_{ON}$ when the SR flip-flop SR1 is deactivated. The output signal ON of the SR flip-flop SR1 signals the switch-on and switch-off of the MOS transistor $M_P$ (e.g. via a gate diver circuit 13). In the present example, the MOS transistor $M_P$ is switched on when the output signal ON of the SR flip-flop SR1 is set to a high level, and the MOS transistor $M_P$ is switched off when the output signal ON of SR flip-flop SR1 is reset to a low level (see also FIG. 7B).

As mentioned, the masking circuit 110, which is connected between the comparator $CMP_1$ and the SR flip-flop SR1, is provided to avoid a multiple switch-on of the power MOS transistor MP as well as an early switch-off during a cycle of the substrate voltage $V_{SUBST}$. To ensure that the SR flip-flop SR1 is only set once in each cycle of the substrate voltage $V_{SUBST}$ the masking circuit 110 includes an edge-triggered monoflop MF1, which is also referred to as "one-shot". The monoflop MF1 is configured to generate a single pulse at its output in response to a rising edge in the comparator output signal C, which is applied to the input of the monoflop MF1. Once an output pulse (a "shot") has been generated by the monoflop MF1 to set the SR flip-flop SR1, no further output pulses can be generated before reset of the monoflop MF1, e.g. by reset signal RES. The reset signal RES may be provided by the supply circuit shown in FIG. 6 or any other circuit configured to detect the start of a new cycle of the substrate voltage $V_{SUBST}$. In essence, the output of the monoflop MF1 (and thus the set-input (S) of the SR flip-flop SR1) is masked for the rest of the cycle of the substrate voltage $V_{SUBST}$ once a set pulse has been generated for the SR flip-flop SR1.

Furthermore, the masking circuit 110 includes a timer circuit TMR that may be coupled between the output (Q) of the SR flip-flop SR1 and (e.g. via a gate circuit G1) the reset input (R) of the SR latch FL2. The timer circuit TMR is triggered by the output signal ON of SR flip-flop SR1 and generates an output signal (masking signal X) that has a high-level except for a defined time span $T_{MASK}$ directly after the SR flip-flop SR1 has been set. That is, the masking signal exhibits a low-level during the time span $T_{MASK}$. While signal X is low, any reset signal (provided by inverter I1) for resetting the SR flip-flop SR1 (and thus for switching-off the MOS transistor $M_P$) is masked. The SR flip-flop SR1 can be reset by a reset pulse in the inverted comparator output signal $\overline{C}$ which is supplied to the reset input (R) of the SR flip-flop SR1 via AND gate G1, which blanks the signal $\overline{C}$ while the masking signal X (supplied to a first input of the AND gate G1) is at a low-level. In other words, the inverted comparator output signal $\overline{C}$, which is applied to the second input of AND-gate G1, cannot pass from the second input to the output of the AND-gate G1 during the time span $T_{MASK}$, because the masking signal X forces the output of the AND-gate G1 to a low level.

The timer circuit TMR may also trigger the switch-over from the reference voltage $V_R=V_{ON}$ to $V_R=V_{OFF}$, which is used by the comparator $CMP_1$. Basically, the switch-over is triggered upon activation of the SR flip-flop SR1, which is indicated by signal ON. However, the switch-over is delayed by a time $T_{MASK}$. Accordingly, the signal X may be combined with the output signal ON using AND-gate G2. Thus, the switch-over from $V_R=V_{ON}$ to $V_R=V_{OFF}$ is triggered by the output of AND-gate G2. In the present example, the switch-over from $V_R=V_{OFF}$ back to $V_R=V_{ON}$ may be triggered by the reset signal $\overline{C}$.

Figure 9:
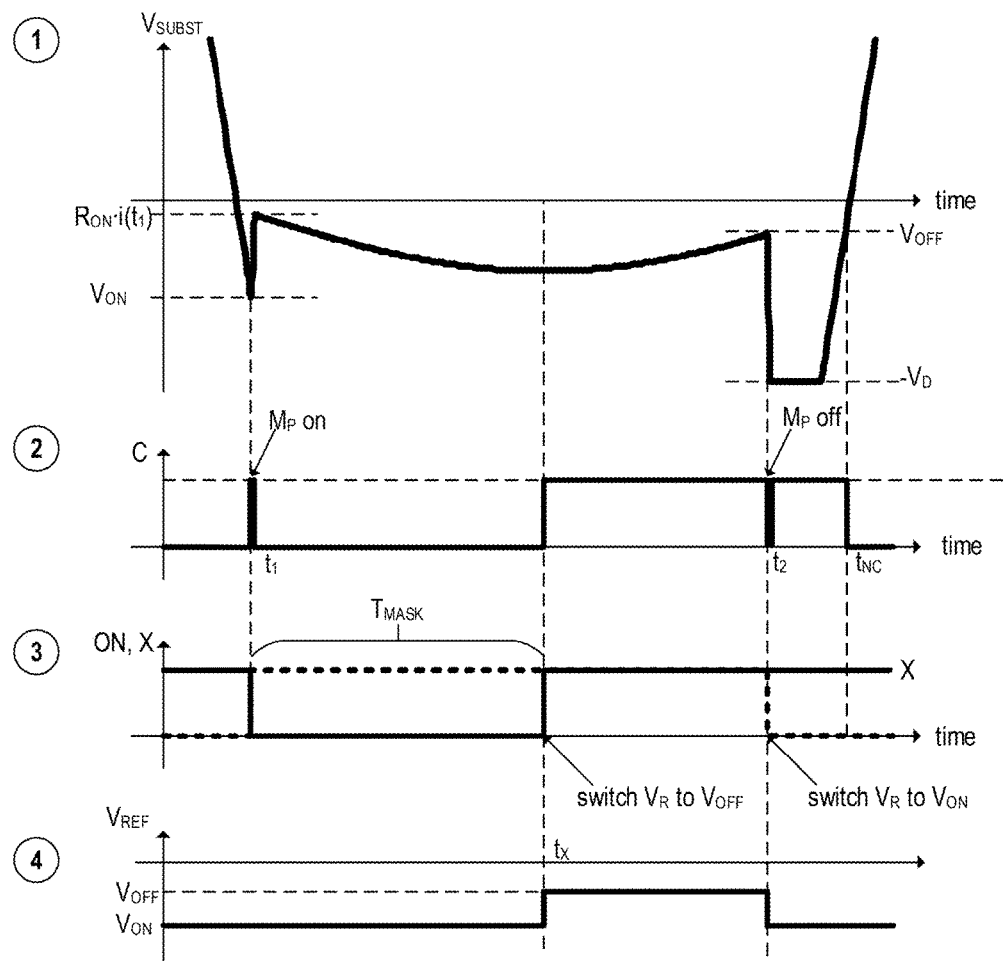
FIG. 9 includes four timing diagrams illustrating the function of the control logic of FIG. 8 in more detail.

The function of the exemplary control logic of FIG. 8 is further explained below with reference to the timing diagrams shown in FIG. 9. The first timing diagram of FIG. 1 is essentially the same as the top diagram of FIG. 7B and shows the second portion of a cycle, during which the substrate voltage $V_{SUBST}$ is negative. When the substrate voltage $V_{SUBST}$ becomes negative, it keeps falling until it reaches the comparator threshold voltage $V_R=V_{ON}$ at time instant $t_1$ (see first diagram of FIG. 9). At this time instant $t_1$ the comparator output of comparator $CMP_1$ (see FIG. 8) rises to a high level thus triggering the one-shot monoflop MF1, which generates a pulse to set the SR flip-flop SR1. The output signal ON of SR flip-flop SR1 is shown in the third diagram of FIG. 9 as dotted line. Upon activation of SR flip-flop SR1 the MOS channel of the transistor $M_P$ is activated via gate driver 13. As soon as the MOS channel is conductive, the substrate voltage $V_{SUBST}$ rises close to zero volts, i.e. to $R_{ON} \cdot i(t_1)$, wherein $i(t_1)$ is the load current at time $t_1$ an $R_{ON}$ the on-resistance of the MOS channel. The product $R_{ON} \cdot i(t_1)$ may be in the range of approximately 100 mV. Dependent on the implementation of the MOS transistor $M_P$, the load current, and the temperature this value may be lower or higher. As the substrate voltage $V_{SUBST}$ rises after $t_1$ the comparator output signal C again drops to a low level (see second diagram in FIG. 9), so that only a short pulse occurs at the comparator output at time $t_1$.

As mentioned above with regard to FIG. 8, the timer circuit TMR is triggered at time instant $t_1$ and outputs a masking signal X, which is at a low-level for a time span $T_{MASK}$ after time instant $t_1$ (until $t_X=t_1+T_{MASK}$). At time $t_X$ the masking signal X (see third diagram of FIG. 9, solid line) rises again to a high level, and the output signal of gate G2 (logic conjunction X AND ON) is used to trigger the switch-over from the threshold voltage $V_R=V_{ON}$ to $V_R=V_{OFF}$, which is used by the comparator $CMP_1$. Thus, the comparator threshold voltage $V_R$ is switched a time span $T_{MASK}$ after activation of the MOS transistor $M_P$. The threshold voltage $V_{OFF}$ will be (negative but) close to zero volts and may therefore be higher than the first threshold voltage $V_{ON}$. In the present example, the comparator output signal C will rise from a low level to a high level at time $t_X$ when the comparator reference voltage $V_R$ is set from $V_{ON}$ to $V_{OFF}$. At time instant $t_2$, the substrate voltage $V_{SUBST}$ ($=R_{ON} \cdot i(t)$ between times $t_1$ and $t_2$) reaching the comparator threshold $V_R=V_{OFF}$ causes the comparator output signal C to drop to a low level, which triggers a reset of the SR flip-flop SR1 (see FIG. 8, the falling edge in signal C at time $t_2$ is converted to a rising edge by inverter I1) and switches the MOS transistor $M_P$ off. As a consequence, the load current $i(t_2)$ is taken over by the MOS transistor's intrinsic reverse diode $D_R$ and thus the substrate voltage $V_{SUBST}$ drops to a voltage $-V_D$, which is the negative forward voltage of the body diode $D_R$ ($-V_D \approx -600$ mV at room temperature). The time span between the switch-off of the MOS transistor $M_P$ (at time $t_2$) and the end of the cycle (the subsequent zero-crossing in the substrate voltage $V_{SUBST}$ is comparably short so that the energy dissipation is kept low).

Figure 10A:
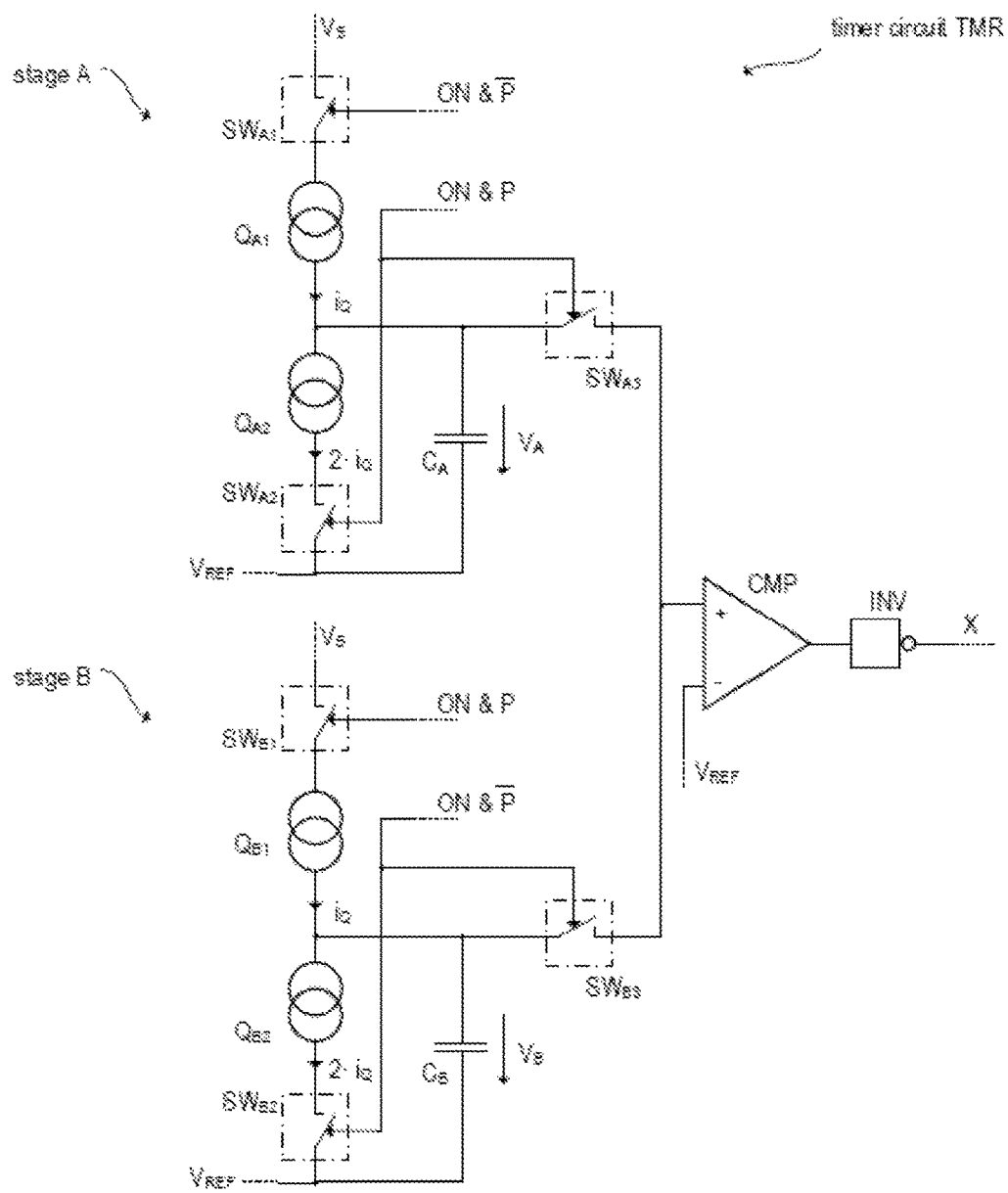
FIGS. 10A and 10B illustrate a timer circuit which may be used in the control circuit of FIG. 8 for masking an early switch-off of the MOSFET.
Figure 10B:
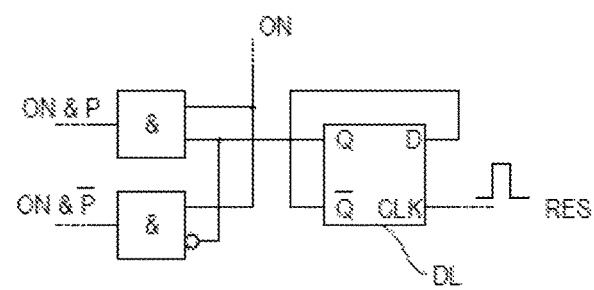

The cycle time of the substrate voltage $V_{SUBST}$ may depend on the application. When the AC voltage is provided by the electric power grid (e.g. via a transformer), the cycle time is substantially constant at approximately 20 ms (for 50 Hz AC voltage) or 16.7 ms (for 60 Hz AC voltage) or 60 ms (for 16.7 HZ AC voltage). In such applications, the time $T_{MASK}$ indicated by the timer circuit TMR may be set to a constant value. However, in other applications such as in automobiles, the AC voltage may be generated, e.g., by an alternator, and the frequency of the AC voltage varies with the rotational speed of the alternator (which may be connected to the combustion engine of an automobile). In such applications it may be necessary to adjust the time $T_{MASK}$ dependent on the frequency or the cycle time of the AC voltage, which corresponds to the cycle time of the substrate voltage $V_{SUBST}$. FIGS. 10A and 10B illustrate one exemplary analog circuit which may be used to flexibly set the time span $T_{MASK}$ and thus the time instant $t_X$ (see FIG. 9), at which the threshold values are changed from $V_{ON}$ to $V_{OFF}$. It is understood that digital implementation with counters or integrators may be alternatives to the depicted analog implementation, and a person skilled in the art will readily be able to conceive various digital and analog implementations which basically provide the same function as the depicted example.

Generally, the masking circuit 110 is a sub-system configured to measure the length of the on-time $T_{ON}$ (see FIG. 7B) of the MOS transistor $M^P$ during a previous cycle of the substrate voltage $V_{SUBST}$. This measurement may be accomplished in various ways; it may be done digitally (e.g, using a counter) as well as analog (e.g. using an integrator). The output X of masking circuit 110 is at a low level ($\approx 0$V) between the switch-on of the MOS transistor $M_P$ (see, e.g., FIG. 9, time $t_1$) and approximately the 50 percent of the on-time time $T_{ON}$ of the MOS transistor $M_P$ during the previous cycle ($T_{MASK} \approx 0.5 \cdot T_{ON}$). This percentage may be different from 50 percent, dependent on the actual implementation. However, the masking time $T_{MASK}$ should be long enough to prevent an early switch-off of the MOS transistor $M_P$. It is understood that a ratio $T_{MASK}/T_{ON}$ of approximately 0.5 is merely an illustrative example. In other implementations, the ration may be lower or higher than 0.5. Furthermore, the ratio $T_{MASK}/T_{ON}$ may depend on the frequency of the substrate voltage $V_{SUBST}$ and thus on the rotational speed of the alternator. The ratio $T_{MASK}/T_{ON}$ may be chosen higher for higher alternator speeds.

As mentioned above, the masking circuit 110 prevents the power MOS transistor $M_P$ from switching off for a defined masking (blanking) time $T_{MASK}$. Nevertheless, in real applications (e.g. rectifying the voltage generated by an automotive alternator), undesired, abnormal situations may occur, in which the substrate voltage may become positive during the masking time $T_{MASK}$. In such situations, the masking circuit may be overridden (or deactivated) by a protection circuit, which is configured to switch-off the MOS transistor $M_P$ to avoid short-circuits.

The circuit of FIGS. 10A and 10B illustrates one exemplary implementation of the timer circuit TMR used in the masking circuit 110 of the control logic shown in FIG. 8. FIG. 10A includes two substantially identical charging circuits (labeled "stage A" and "stage B"), which may be used to flexibly determine the time span $T_{MASK}$ dependent on the cycle time of the alternating substrate voltage $V_{SUBST}$. Each charging circuit include a capacitor $C_A$, $C_B$ that is charged by a constant current $i_Q$ for the time span $T_{ON}$ (see, FIG. 7B) in one cycle and discharged by a constant current $2 \cdot i_Q$ in the subsequent cycle. Thus, the time needed to discharge the capacitor $C_A$, $C_B$ determines the time span $T_{MASK}$, which is $T_{ON}/2$ since the discharging current is twice the charging current. As mentioned above, a discharging current different from $2 \cdot i_Q$ (resulting in the mention ratio of 0.5) is possible. Generally a discharging current of $r \cdot i_Q$ would result in a ratio $1/r$. It is understood, that substantially the same function can be readily implemented using digital circuitry, such as, for example, counters or digital integrators, comparators, etc.

The capacitors $C_A$, $C_B$ are connected to current sources $Q_{A1}$, $Q_{A2}$ and, respectively $Q_{B1}$, $Q_{B2}$. Current sources $Q_{A1}$ and $Q_{B1}$ generate the charging current $i_Q$, whereas current sources $Q_{A2}$ and $Q_{B2}$ generate the discharging current $2 \cdot i_Q$. Each of the current sources $Q_{A1}$, $Q_{A2}$, $Q_{B1}$, and $Q_{B2}$ can be switched on and off by respective switches $SW_{A1}$, $SW_{A2}$, $SW_{B1}$, and $SW_{B2}$. The charging currents $i_Q$ are generated by current sources $Q_{A1}$ and $Q_{B1}$, whereas the discharging currents $2 \cdot i_Q$ are generated by current sinks $Q_{A2}$ and $Q_{B2}$. The two charging circuits operate in an alternating manner. That is, capacitor $C_A$ is charged during even cycles and discharged during odd cycles of the substrate voltage $V_{SUBST}$, whereas capacitor $C_B$ is charged during odd cycles and discharged during even of the substrate voltage $V_{SUBST}$. In the present example, signal P may be used to distinguish even cycles from odd cycles, wherein a high level (P=1) may indicate an odd cycle and a low level may indicate an even cycle. Further, the capacitors are only charged and discharged while the MOSFET $M_P$ is switched on, i.e. when signal ON is at a high level (ON=1, see FIG. 8). Accordingly, switches $SW_{A1}$ and $SW_{B2}$ are switched on while ON=1 and P=0 (logic conjunction ON & $\overline{P}$), whereas $SW_{A2}$ and $SW_{B1}$ are switched on while ON=1 and P=1 (logic conjunction ON & P). While the capacitors $C_A$, $C_B$ are discharged by the constant current $2 \cdot i_Q$, the respective capacitor voltage $V_A$ or $V_B$ is applied to the input of a comparator CMP via a further switch $SW_{A3}$ or $SW_{B3}$, respectively. The comparator CMP signals, at its output, a low level as soon as the capacitor $C_A$, $C_B$ is discharged, which is, in the present example, a time $T_{MASK}=T_{ON}/2$ after activation of the power MOSFET $M_P$. One can see that the time needed for discharging will always be half of the time needed for charging (which is $T_{ON}$) regardless of the actual duration of the time span $T_{ON}$. Finally, the comparator output signal is inverted to generate the masking signal X, which exhibits a low level during the time span $T_{MASK}$ (see also FIG. 9).

FIG. 10B illustrates one example of a circuit that may be used to generate the signal P. The example of FIGS. 10A and 10B includes basically a clocked D-latch which is connected to form a frequency divider. That is, the latch receives the reset signal RES as input signal at the clock input CLK, while the inverted latch output $\overline{Q}$ is fed back to the latch input D. The signal P is provided at the non-inverted latch output Q. Two AND-gates may be used to obtain the logic conjunctions ON & $\overline{P}$ and ON & P needed to control the switches $SW_{A1}$, $SW_{A2}$, $SW_{A3}$, $SW_{B1}$, $SW_{B2}$, $SW_{B3}$ as described above.

Figure 11:
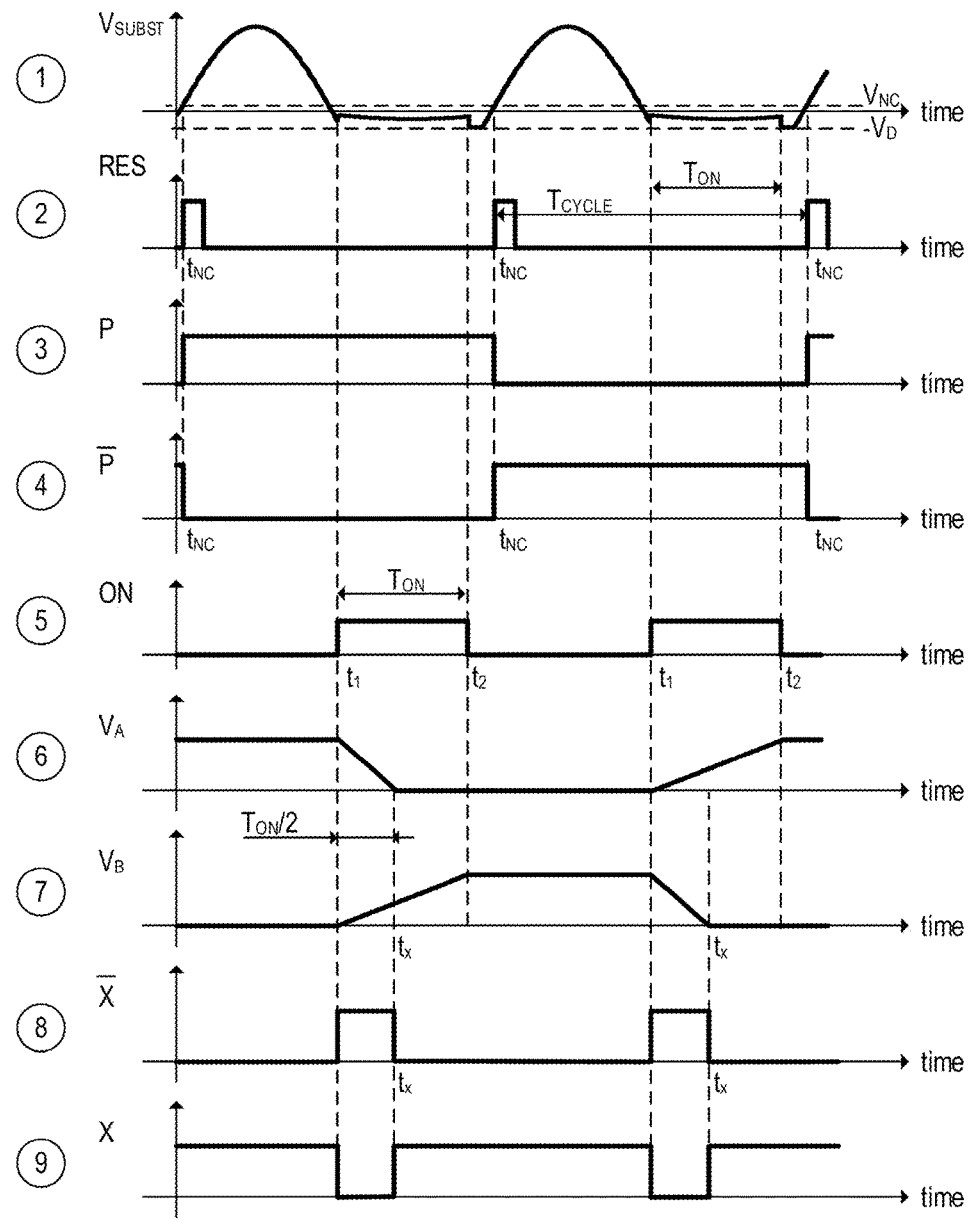
FIG. 11 includes timing diagrams illustrating the function of the timer circuit of FIGS. 10A and 10B in more detail.

The function of the exemplary timer circuit of FIGS. 10A and 10B (with a ratio $T_{MASK}/T_{ON}\approx 0.5$) is further illustrated by the timing diagrams shown in FIG. 11. The first timing diagram of FIG. 11 illustrates two cycles (cycle time $T_{CYCLE}$) of the alternating substrate voltage $V_{SUBST}$ (cf. FIG. 7A). The second timing diagram illustrates the corresponding reset signal, which exhibits a short reset pulse at each time instant $t_{NC}$, at which the substrate voltage exceeds the threshold voltage $V_{NC}$. In the present example, the threshold voltage $V_{NC}$ has a small positive value (e.g. 80 mV). However, the threshold voltage $V_{NC}$ may also be zero (see cycle detection circuit in FIG. 6). The third and the fourth timing diagrams of FIG. 11 illustrate the signal P and its inverse $\overline{P}$ as generated by the circuit shown in FIG. 10B. One can see, the period of signal P is $2\cdot T_{CYCLE}$, and P exhibits a high level during odd cycles of the substrate voltage $V_{SUBST}$ and exhibits a low level during odd cycles. The fifth timing diagram of FIG. 11 illustrates the output signal ON of SR flip-flop SR1 (see FIGS. 8 and 9). The sixth and the seventh timing diagrams of FIG. 11 illustrate the capacitor voltages $V_A$ and $V_B$ across the capacitors $C_A$ and $C_B$, respectively. As explained above, the two capacitors $C_A$ and $C_B$ are charged and discharged in an alternating manner. That is, the two signal waveforms representing the capacitor voltages are time shifted with respect to each other by one period $T_{CYCLE}$. One can see that the capacitors $C_A$ and $C_B$ are charged for a time $T_{ON}$ (i.e. between the time instants $t_1$ and $t_2$) and discharged for a time $T_{ON}/2$ (i.e. between the time instants $t_1$ and $t_x$). The comparator output signal $\overline{X}$ is illustrated in the eighth timing diagram of and the masking signal X in the ninth timing diagram of FIG. 11. One can see that the masking signal X falls to a low level when the signal ON signals a switch-on of the power MOS transistor $M_P$ and returns to a high level after the masking time $T_{MASK}$, which equals $T_{ON}/2$ in the present example. As mentioned, different ratios may be applicable in other implementations.

Figure 12:
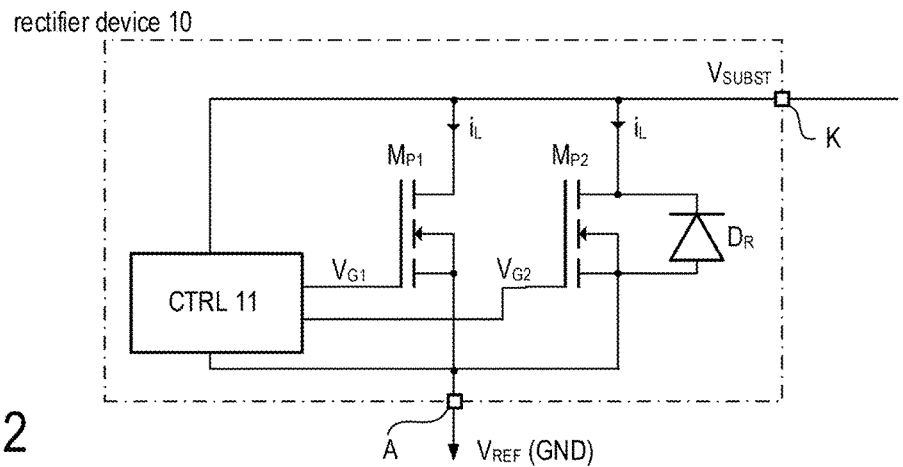
FIG. 12 illustrates an alternative to the example of FIG. 4, wherein two or more power MOSFETs are used instead of a single power MOSFET.

As mentioned above with respect to FIG. 3, the power MOS transistor $M_P$ may be an implemented as a vertical MOSFET that is composed of a plurality of transistor cells. That is, the source-drain current paths (or the emitter-collector current paths in case of an IGBT) of the individual transistor cells are connected in parallel to form the transistor $M_P$. To switch the transistor on and off the gate electrodes of all transistor cells are connected so that the gate electrodes are charged and discharges simultaneously. In the embodiments described below the rectifier device 10 includes two or more MOS transistors $M_{P1}$, $M_{P2}$, which are connected in parallel but have separate gate terminals. The MOS transistors $M_{P1}$, $M_{P2}$ may be formed by the transistor cells of a single cell array, wherein the gate electrodes of a first group of transistor cells are connected to the gate terminal of transistor $M_{P1}$ and the gate electrodes of a second group of transistor cells are connected to the gate terminal of transistor $M_{P2}$, while all transistor cells of the cell array share a common source electrode and a common drain electrode. In one example, the first group of transistor cells may include approximately 90 percent of the transistor cells of the cell array while the second group includes the remaining 10 percent. An example of such a rectifier device 10 with two power MOS transistors $M_{P1}$ and $M_{P2}$ is illustrated by the equivalent circuit in FIG. 12. Different from the example of FIG. 4, the control circuit 11 needs to generate two gate signals $V_{G1}$ and $V_{G2}$ instead of one to switch the transistors $M_{P1}$ and $M_{P2}$ on and off. The further description related to the example, in which two MOS transistors $M_{P1}$ and $M_{P2}$ are electrically connected in parallel as illustrated in FIG. 12. However, it is noted that a parallel circuit of three or more MOS transistors may also be used instead.

Figure 13:
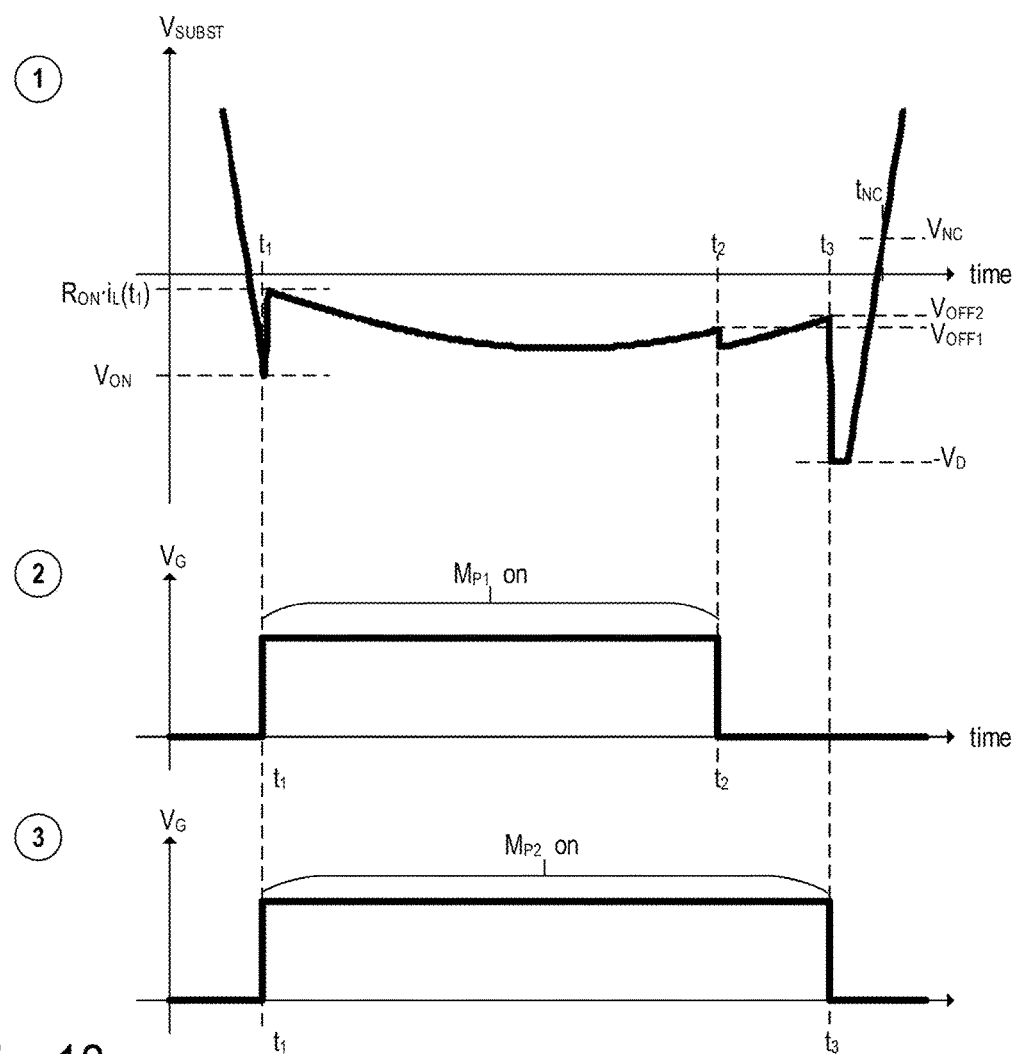
FIG. 13 includes timing diagrams illustrating the voltage drop across the rectifier device of FIG. 12, wherein—when activated—the MOS channels of both power MOSFETs bypass the body diode when the diode is forward biased and wherein the two power MOSFETs are switched of one after the other.

The timing diagrams of FIG. 13 illustrate one exemplary switching scheme for switching the MOS transistors $M_{P1}$ and $M_{P2}$ included in the rectifier device 10 of FIG. 12 on and off while the diode $D_R$ (which is the intrinsic body diode of transistors $M_{P1}$ and $M_{P2}$) is forward biased. Similar as in the example of FIG. 7B, both MOS transistors, $M_{P1}$ and $M_{P2}$, are switched on, when the control circuit 11 detects that the substrate voltage $V_{SUBST}$ is negative (i.e. the diode $D_R$ is forward biased). To determine the time instants for switching the MOS transistors $M_{P1}$ and $M_{P2}$ on and off negative threshold voltages $V_{ON}$, $V_{OFF1}$ and $V_{OFF2}$ may be used as explained below. Accordingly, both MOS transistors $M_{P1}$ and $M_{P2}$ are switched on, when the substrates voltage $V_{SUBST}$ reaches or falls below the first threshold $V_{ON}$. In the present example, the condition $V_{SUBST}=V_{ON}$ is fulfilled at time $t_1$ and the gate voltages $V_{G1}$ and $V_{G2}$ (see second and third diagram of FIG. 13) are set to a high level to switch on the MOS transistor $M_{P1}$ and $M_{P2}$. However, different from the example of FIG. 7B, only the first MOS transistor $M_{P1}$ is switched off again, when the substrate voltage $V_{SUBST}$ reaches or exceeds the second threshold $V_{OFF}$ at the end of a cycle while the second MOS transistor $M_{P2}$ remains on. In the present example, the condition $V_{SUBST}=V_{OFF1}$ is fulfilled at time $t_2$ and the gate voltage $V_{G1}$ (see second diagram of FIG. 13) is set to a low level to switch the MOS transistor $M_{P1}$ off. When the MOS transistor $M_{P1}$ is switched off at time instant $t_2$, the substrate voltage $V_{SUBST}$ may abruptly fall to a lower level, as the overall on-resistance $R_{ON}$ is increased due to the switch-off of those transistor cells which form the MOS transistor $M_{P2}$. However, as the load current decreases towards the end of the cycle, the substrate voltage keeps rising and the second MOS transistor $M_{P2}$ is eventually also switched off when the substrate voltage $V_{SUBST}$ reaches the third threshold level $V_{OFF2}$. As soon as both MOS transistors $M_{P1}$ and $M_{P2}$ are off the substrate voltage $V_{SUBST}$ may abruptly fall to –VD before it again rises to positive values at the beginning of the next cycle (reset pulse at time instant $t_{NC}$).

Figure 14:
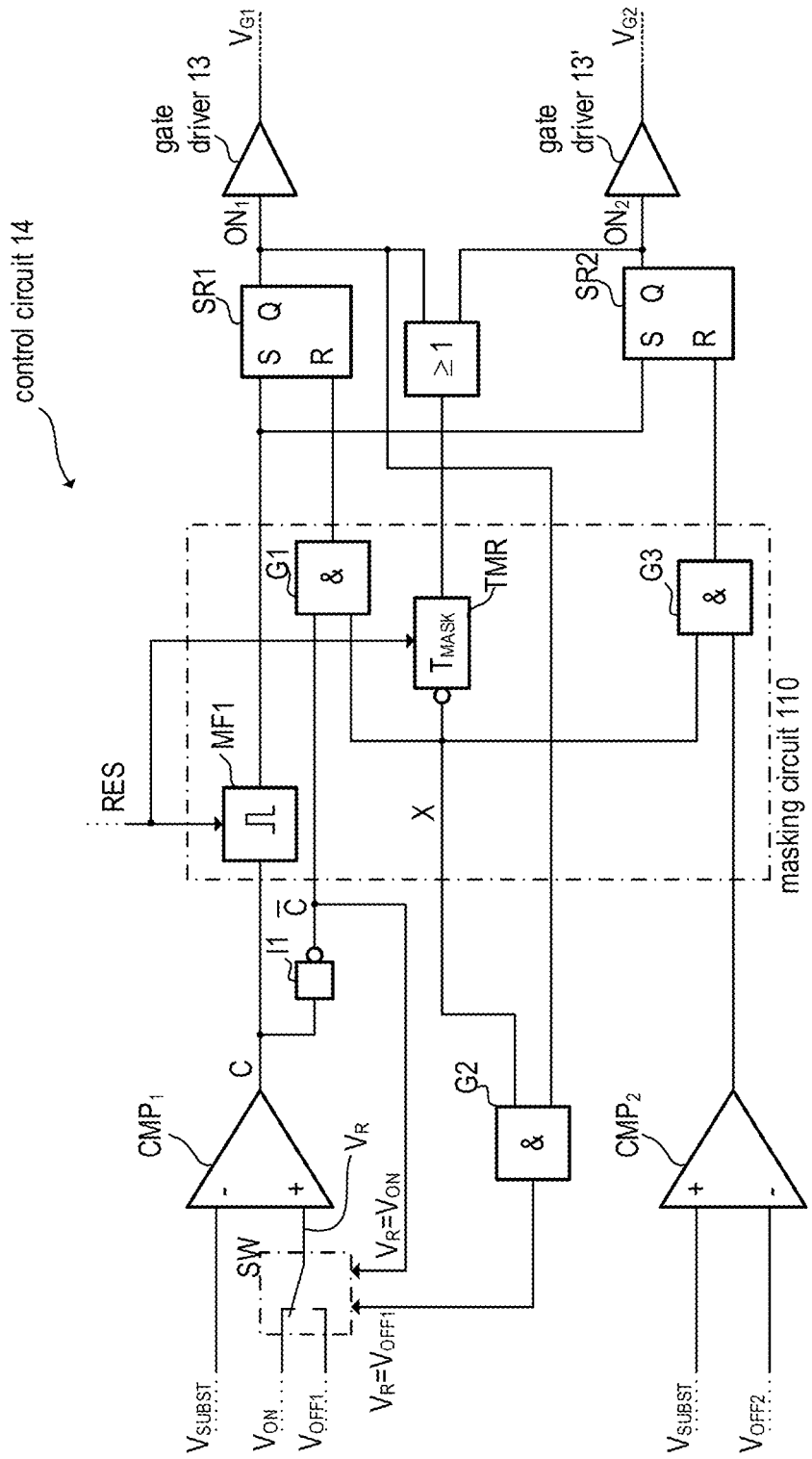
FIG. 14 illustrates an exemplary control logic, which is similar to the example of FIG. 8 but suitable for rectifier devices with two power MOSFETs as shown in FIG. 12.

FIG. 14 is a block diagram illustrating one exemplary implementation of a control logic for the control circuit 11 (see FIG. 12) which is designed to switch the MOS transistors $M_{P1}$ and $M_{P2}$ on and off as illustrated in the timing diagrams of FIG. 13. Various circuit components used in the circuit of FIG. 14 may be supplied by a supply circuit 12 as shown, for example, in FIG. 6 (internal supply voltage $V_S$). In essence the example of FIG. 14 is an enhanced version of the example of FIG. 8. The control logic needed to activate and deactivate the SR flip-flop SR1 is essentially the same as in the previous example of FIG. 8. However, the output signal of SR flip-flop SR1 is denoted ON and the corresponding threshold as $V_{OFF1}$ as mentioned above. In addition to the example of FIG. 8, the present control logic includes a further SR flip-flop SR2, a further comparator $CMP_2$ and the masking circuit 110 includes an additional AND-gate G3. The set inputs of the two SR flip-flops SR1 and SR2 are connected to that the flip-flops are set simultaneously. The output signal of SR flip-flop SR2 is denoted as $ON_2$ and provided to gate driver 13' that generates a corresponding gate signal $V_{G2}$.

The comparator $CMP_2$ receives the substrate voltage $V_{SUBST}$ and the second threshold voltage $V_{OFF2}$ as input signals, wherein the substrate voltage is supplied to the non-inverting input and the second threshold voltage $V_{OFF2}$ to the inverting input of comparator $CMP_2$ so that the comparator output signals a high level when the substrate voltage $V_{SUBST}$ exceeds the second threshold voltage $V_{OFF2}$. As shown in FIG. 13, the second MOS transistor $M_{P2}$ is to be switched off, when the substrate voltage $V_{SUBST}$ reaches the second threshold voltage $V_{OFF2}$. Therefore the output of comparator $CMP_2$ is coupled (via the masking circuit 110) to the reset input of the SR flip-flop SR2 in order to deactivate SR flip-flop SR2 when the comparator $CMP_2$ indicates that the substrate voltage $V_{SUBST}$ has reached the second threshold voltage $V_{OFF2}$. The masking circuit 110 prevents an undesired early switch-off of both transistors, $M_{P1}$ and $M_{P2}$. To prevent a switch-off of the second transistor $MP_2$ during the time span $T_{MASK}$, the masking signal X blanks the output signal of comparator $CMP_2$ so that it cannot reset SR flip-flop SR2. This blanking is accomplished by AND-gate G3 in the same manner as AND-gate G1 blanks the reset signal supplied to SR flip-flop SR1 (cf. FIG. 8).

Figure 15:
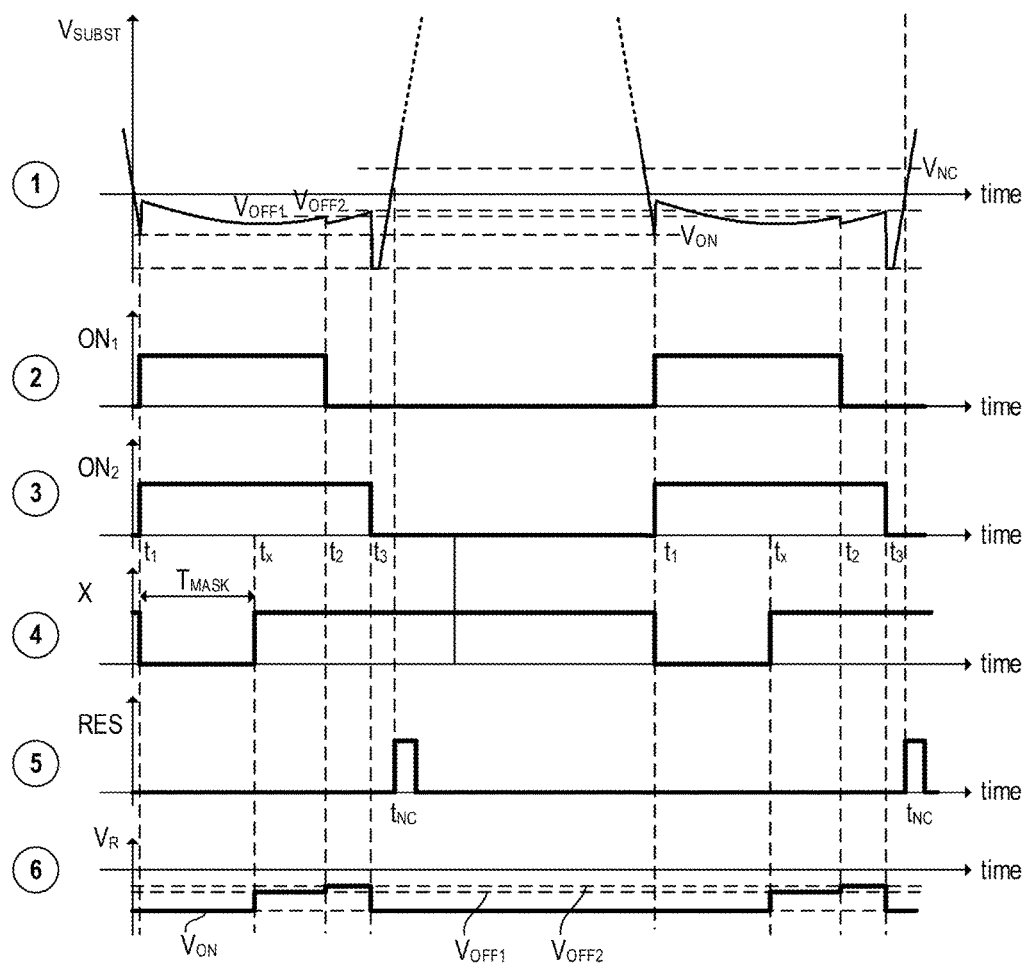
FIG. 15 includes timing diagrams illustrating the function of the control logic of FIG. 14.
Figure 16:
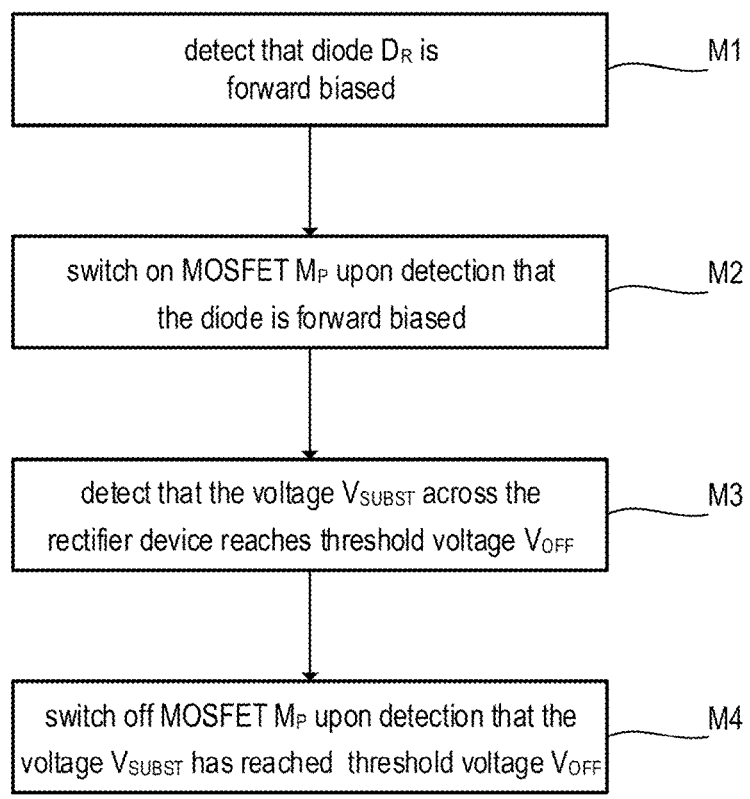
FIG. 16 illustrates a flow chart illustrating one exemplary method for operating a rectifier device.

The function of the control logic of FIG. 14 is further illustrated by the timing diagrams depicted in FIG. 15. The first timing diagram of FIG. 15 illustrates the alternating substrate voltage $V_{SUBST}$ and the mentioned five threshold levels $V_{ON}$, $V_{OFF1}$, $V_{OFF2}$, $V_{PROT}$, and $V_{NC}$. The second and third timing diagrams of FIG. 16 illustrate the output signals $ON_1$ and $ON_2$ of the SR flip-flops SR1 and SR2, respectively. Both signals $ON_1$ and $ON_2$ are set to a high-level at time instant $t_1$ when the substrate voltage $V_{SUBST}$ reaches the threshold voltage $V_{ON}$. The signal $ON_1$ is set back when the substrate voltage $V_{SUBST}$ reaches the threshold voltage $V_{OFF1}$ at time instant $t_2$, and the signal $ON_2$ is set back when the substrate voltage $V_{SUBST}$ reaches the threshold voltage $V_{OFF}$ at time instant $t_2$. The fourth timing diagram of FIG. 15 illustrates the masking signal X and the fifth timing diagram of FIG. 16 illustrates the reset signal RES. The sixth timing diagram of FIG. 15 shows how the threshold voltage $V_R$ used by comparator $CMP_1$ are switched from $V_{ON}$ to $V_{PROT}$ at the begin of the masking time period $T_{MASK}$, then to $V_{OFF1}$ at the end of the masking time period $T_{MASK}$, then to $V_{OFF2}$ at time instant $t_2$ (when the switch-off of the first MOS transistor $M_{P1}$ is triggered), and finally back to $V_{ON}$ at time instant $t_3$ (when the switch-off of the second MOS transistor $M_{P2}$ is triggered). It is again noted that both signals $ON_1$ and $ON_2$ would be immediately reset to a low level if the substrate voltage $V_{SUBST}$ rises (due to some anomaly) above the threshold $V_{PROT}$ during the masking time period $T_{MASK}$.

As shown in the first timing diagram of FIG. 15, four threshold voltages are used by the control logic of FIG. 14. In the examples described herein, three threshold voltages may be negative. For example, the threshold voltage $V_{ON}$ may be −250 mV, the threshold voltage $V_{OFF}$ may be −50 mV, the threshold voltage $V_{OFF}$ may be −20 mV, and the threshold voltage $V_{NC}$ may be +600 mV. It is understood that these numbers have to be regarded as illustrative examples and the actual values may be different. In case the transistor cells of the power MOS transistor are switched off in a single step (see example of FIG. 4 with one power MOS transistor $M_P$), the threshold voltage $V_{OFF2}$ is not needed. In case the transistor cells of the power MOS transistor are switched off in more than two steps, additional threshold voltages may be needed. However, the threshold voltages $V_{OFF1}$ and $V_{OFF2}$ may also be equal. Theoretically, the threshold voltages $V_{OFF1}$ and $V_{OFF2}$ may be set to zero. However, small negative values may have help to ensure that the comparators do not switch off the power MOS transistors too late due to production tolerances. For example, a threshold voltage $V_{OFF}$ of zero volts may result in the comparator switching actually at +20 mV due to the mentioned tolerances. The last diagram of FIG. 14 illustrates the switching of the threshold values similar to the fourth diagram of FIG. 9.

It is understood, with regard to the examples of the control logic illustrated in FIGS. 8 and 14, that a skilled person can find various other circuit implementations which substantially provide the same or a similar function. Therefore, it is emphasized that the implementations illustrated herein have to be regarded as illustrative examples only. A skilled person will readily find various other implementations which provide substantially the same function as the depicted examples. In fact, the actual implementation may heavily depend on the semiconductor technology used to fabricate integrated circuits. Furthermore, it is understood that the depicted implementations are represented by simplified equivalent circuits, in which components, which are not needed to describe the example, have been omitted. Nevertheless, a skilled person will readily be able to implement the depicted examples in any suitable semiconductor technology.

FIG. 16 illustrates a flow chart illustrating one exemplary method for operating a rectifier device, which may be implemented according to one of the examples described herein (e.g. rectifier device 10 as shown in FIG. 4). Accordingly, the rectifier device includes a semiconductor switch and a diode coupled in parallel between a first and a second terminal of the rectifier device (see, e.g., FIG. 4 MOSFET $M_P$, diode $D_R$). In accordance with the example of FIG. 16, the method includes detecting that the diode $D_R$ is forward biased (see FIG. 16, step M1). This detection may be accomplished, for example, by detecting that the voltage $V_{SUBST}$ across the rectifier device 10 falls below the threshold voltage $V_{ON}$ as illustrated in FIGS. 7A and 7B. The semiconductor switch $M_P$ is switched on (see FIG. 16, step M2) upon detection that the diode $D_R$ is forward biased. The method further includes detecting—while the diode $D_R$ is forward biased—that the voltage $V_{SUBST}$ reaches a the threshold voltage $V_{OFF}$ (see FIG. 16, step M3). The semiconductor switch $M_P$ is switched off upon detection that the voltage $V_{SUBST}$ has reached the threshold voltage $V_{OFF}$ (see FIG. 16, step M3).

In case the rectifier device is implemented with two or more semiconductor switches (e.g. with MOSFET $M_{P1}$ and $M_{P2}$ as shown in FIG. 12), the switch-off may be effected in two steps as, for example, illustrated in FIG. 13. It is again noted, that the method steps may be implemented in various ways. These encompass using digital and analog as well as mixed-signal circuits. Digital circuits may include hardwired circuit components as well as programmable processors (e.g. microcontrollers or the like) that are controlled by software instructions.

Several aspects of the embodiments described herein are summarized below. It is noted, however, that the following summary is not an exhaustive enumeration of features but rather an exemplary selection of features which may be important or advantageous in some applications. In accordance with one example (Example 1), a rectifier includes a semiconductor substrate and further includes an anode terminal and a cathode terminal connected by a load current path of a first MOS transistor and a diode that is connected parallel to a load current path. An alternating input voltage is operably applied between the anode terminal and the cathode terminal. Further, the rectifier includes a control circuit that is configured to switch the first MOS transistor on for an on-time period, during which the diode is forward biased. The first MOS transistor, the diode, and the control circuit are integrated in the semiconductor substrate.

Example 2: The rectifier device according to example 1, wherein the control circuit is configured to detect the begin of the on-time period by detection that the diode has become conductive.

Example 3: The rectifier device according to example 1 or 2, wherein the control circuit is configured to detect the begin of the on-time period by detecting that the voltage drop across the diode has reached a defined first threshold voltage.

Example 4: The rectifier device according to example 3, wherein the control circuit is configured to detect the end of the on-time period by detecting that the voltage drop across the load current path of the first semiconductor switch has reached a defined second threshold voltage.

Example 5: The rectifier device according to example 4, wherein the second threshold level is closer to zero than the first threshold level.

Example 6: The rectifier device according to any of examples 1 to 5, further including: at least a second MOS transistor having a load current path that is connected parallel to the load current path of the first MOS transistor.

Example 7: The rectifier device according to example 6, wherein the control circuit is configured to switch on the first MOS transistor and the second MOS transistor substantially at the same time.

Example 8: The rectifier device according to example 6, wherein the control circuit is configured to switch the second MOS transistor off later than the first MOS transistor.

Example 9: The rectifier device according to example 8, wherein the control circuit is configured to detect the end of the on-time period by detecting that the voltage drop across the load current paths of the first MOS transistor and the second MOS transistor semiconductor switches has reached a defined second threshold voltage; and wherein the second MOS transistor is switched off upon detection that the voltage drop across the load current paths of the first MOS transistor and the second MOS transistor has reached a defined third threshold voltage after the first MOS transistor has been switched off.

Example 10: The rectifier device according to example 9, wherein the third threshold voltage is closer to zero than the second threshold voltage.

Example 11: The rectifier device according to any of examples 1 to 10, wherein the anode terminal and the cathode terminal are the only external terminals of the rectifier device.

Example 12: The rectifier device according to any of examples 1 to 11, wherein the anode terminal is at a reference potential that serves as ground potential for the control circuit.

Example 13: The rectifier device according to any of examples 1 to 12, wherein the first MOS transistor is a first MOSFET and the diode is a body diode of the first MOSFET.

Example 14: The rectifier device of example 13, further including a second MOSFET, wherein the first MOSFET and the second MOSFET are both composed of a plurality of transistor cells.

Example 15: The rectifier device according to example 13 or 14, wherein the first and the second MOSFETs are vertical DMOS transistors.

Example 16: The rectifier device according to any of the examples 1 to 15, wherein the control circuit is configured: to detect the begin of the on-time period by detecting a first time instant, at which the voltage drop across the diode has reached a defined first threshold voltage; to detect the end of the on-time period by detecting a second time instant, at which the voltage drop across the load current path of the first MOS transistor has reached a de-fined second threshold voltage; and to mask out any detection of the second time instant for a defined masking time period.

Example 17. The rectifier device according to example 16, wherein the masking time period is adjusted based on the on-time period in a previous cycle of the alternating input voltage.

Example 18. The rectifier device according to example 17, wherein a capacitor is charged with a charging current during the on-time period in the previous cycle and discharged with a discharging current during the masking time period; the discharging current being a multiple of the charging current.

In accordance with another example (Example 19), the rectifier device includes a plurality of transistor cells integrated in a semiconductor substrate, wherein the transistor cells connect a reference terminal and a substrate terminal of the rectifier device, and wherein a first transistor is composed of transistor cells included in the plurality of transistor cells. Further, the rectifier device includes a diode, which connects the reference terminal and the substrate terminal, and a control circuit that is configured to switch on the first transistor for an on-time period, during which the diode is forward biased.

Example 20: The rectifier device according to example 19, wherein the plurality of transistor cells are arranged in a well region formed in the semiconductor substrate, the well region and the adjoining semiconductor substrate forming a pn-junction of the diode.

Example 21: The rectifier device according to example 19 or 20, wherein the electric potential at the reference terminal serves as ground potential for the rectifier device so that an alternating input voltage operably applied between the substrate terminal and the reference terminal determines a substrate voltage in the semiconductor substrate.

Example 22: The rectifier device according to example 21, wherein the control circuit is configured to determine a begin of the on-time period by detecting a first time instant, on which the substrate voltage falls below a first threshold voltage.

Example 23: The rectifier device according to example 22, wherein the control circuit is configured to determine an end of the on-time period by detecting a second time instant, when the substrate voltage reaches a second threshold voltage.

Example 24: The rectifier device according to example 23, wherein the second threshold voltage is closer to zero than the first threshold.

Example 25: The rectifier device according to example 23 or 24, wherein the control circuit is configured to mask out any detection of the second time instant for a masking time period following the first time instant.

Example 26: The rectifier device according to any of examples 19 to 25, wherein an anode of the diode is connected to the reference terminal and a cathode of the diode is connected to the substrate terminal.

Example 27: The rectifier device according to any of examples 19 to 26, further including at least a second transistor being composed of transistor cells included in the plurality of transistor cells.

Example 28: The rectifier device according to example 27, wherein the control circuit is configured to determine a begin of the on-time period by detecting a first time instant, on which the substrate voltage falls below a first threshold voltage, and wherein the first and the second transistor are switched on at the begin of the on-time.

Example 29: The rectifier device according to example 28, wherein the control circuit is configured to determine a second time instant, at which the substrate voltage exceeds a second threshold voltage, a switch-off of the first transistor being triggered at the second time instant; and wherein the control circuit is configured to determine—after the second time instant—a third time instant, at which the substrate voltage exceeds a third threshold voltage, a switch-off of the second transistor being triggered at the third time instant.

Example 30: The rectifier device according to any of examples 21 to 29, wherein the control circuit comprises a comparator that receives, at a first input, a first input signal that represents the substrate voltage, at a second input, a second input signal that represents a first threshold voltage. Thereby, an output of the comparator signals a first time instant, at which the substrate voltage falls below the first threshold voltage.

Example 31: The rectifier device according to example 30, wherein the first input signal is a scaled and/or level-shifted version of the substrate voltage, and wherein the second input signal is a correspondingly scaled and/or level-shifted version of the first threshold voltage, wherein the scaling and/or level-shifting is designed such that the second input signal has a positive voltage value.

Example 32: The rectifier device according to example 30 or 31, wherein the control circuit further comprises a first flip-flop, which is coupled to the comparator output.

Example 33: The rectifier device according to example 32, wherein the first transistor is switched on and off in accordance with the state of the first flip-flop.

Example 34: The rectifier device according to example 33, wherein the comparator is coupled to the first flip-flop via a one-shot monoflop, which is configured to generate, when triggered by the comparator, only a single pulse before being reset by a reset signal.

Example 35: The rectifier device according to example 33, further including: a timer circuit configured to mask out a reset of the first flip-flop for a masking time period.

Example 36. The rectifier device according to any of examples 21 to 36, wherein the control circuit includes a supply circuit that is configured to generate an internal supply voltage for the control circuit based on the substrate voltage, the supply circuit comprising a buffer capacitor.

Moreover, a method for operating a rectifier device is described therein; the rectifier device includes a semiconductor switch and a diode coupled in parallel between a first and a second terminal. In accordance with one example (Example 37), the method includes detecting that the diode is forward biased, switching on the semiconductor switch upon detection that the diode is forward biased, detecting—while the diode is forward biased—that the voltage across the rectifier device between the first and the second terminal reaches a specific threshold voltage, and switching off the semiconductor switch upon detection that the voltage across the rectifier device has reached the specific threshold value.

Example 38: The method of example 37, further including the generation of an internal supply voltage for the control circuit, based on the voltage across the rectifier device between the cathode terminal and the anode terminal, wherein the electric potential at the anode terminal is used as ground potential.

Example 39: The method of example 37 or 38, wherein the rectifier device comprises a further MOS transistor coupled parallel to the diode between the anode terminal and the cathode terminal. The method further includes: switching on, by a control circuit, the further MOS transistor upon detection that the diode is forward biased; detecting, after the MOS transistor has been switched off, that the voltage across the rectifier device between the cathode terminal and the anode terminal reaches a specific further threshold voltage; and switching off the further MOS transistor upon detection that the voltage across the rectifier device has reached the specific further threshold value.

Although the invention has been illustrated and described with respect to one or more implementations, alterations and/or modifications may be made to the illustrated examples without departing from the spirit and scope of the appended claims. As mentioned above, the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

We claim:
1. A rectifier device comprising:
a semiconductor substrate;
an anode terminal and a cathode terminal connected by a load current path of a first MOS transistor and a diode connected parallel to the load current path; an alternating input voltage is operably applied between the anode terminal and the cathode terminal;
a control circuit that is configured to switch on the first MOS transistor for an on-time period, during which the diode is forward biased; and
only two external terminals, wherein a first external terminal of the only two external terminals comprises the anode terminal, and wherein a second external terminal of the only two external terminals comprises the cathode terminal, wherein the first MOS transistor, the diode and the control circuit are integrated in the semiconductor substrate.

2. The rectifier device according to claim 1, wherein the control circuit is configured to detect the beginning of the on-time period by detection that the diode has become conductive.

3. The rectifier device according to claim 1, wherein the control circuit is configured to detect the begin of the on-time period by detecting that the voltage drop across the diode has reached a defined first threshold voltage.

4. The rectifier device according to claim 3, wherein the control circuit is configured to detect the end of the on-time period by detecting that the voltage drop across the load current path of the first semiconductor switch has reached a defined second threshold voltage.

5. The rectifier device according to claim 4, wherein the second threshold level is closer to zero than the first threshold level.

6. The rectifier device according to claim 1, further comprising:
at least a second MOS transistor having a load current path that is connected parallel to the load current path of the first MOS transistor.

7. The rectifier device according to claim 6, wherein the control circuit is configured to switch on the first MOS transistor and the second MOS transistor substantially at the same time.

8. The rectifier device according to claim 6, wherein the control circuit is configured to switch the second MOS transistor off later than the first MOS transistor.

9. The rectifier device according to claim 8, wherein the control circuit is configured to detect the end of the on-time period by detecting that the voltage drop across the load current paths of the first MOS transistor and the second MOS transistor semiconductor switches has reached a defined second threshold voltage, and
wherein the second MOS transistor is switched off upon detection that the voltage drop across the load current paths of the first MOS transistor and the second MOS transistor has reached a defined third threshold voltage after the first MOS transistor has been switched off.

10. The rectifier device according to claim 9, wherein the third threshold voltage is closer to zero than the second threshold voltage.

11. The rectifier device according to claim 1, wherein the anode terminal is at a reference potential that serves as ground potential for the control circuit.

12. The rectifier device according to claim 1, wherein the first MOS transistor is a first MOSFET and the diode is a body diode of the first MOSFET.

13. The rectifier device according to claim 12, further comprising:
a second MOSFET, wherein the first MOSFET and the second MOSFET are both composed of a plurality of transistor cells.

14. The rectifier device according to claim 13, wherein the first and the second MOSFETs are vertical DMOS transistors.

15. The rectifier device according to claim 1, wherein the control circuit is configured:

to detect the begin of the on-time period by detecting a first time instant, at which the voltage drop across the diode has reached a defined first threshold voltage, to detect the end of the on-time period by detecting a second time instant, at which the voltage drop across the load current path of the first MOS transistor has reached a defined second threshold voltage, and to mask out any detection of the second time instant for a defined masking time period.

16. The rectifier device according to claim 15, wherein the masking time period is adjusted based on the on-time period in a previous cycle of the alternating input voltage.

17. The rectifier device according to claim 16, wherein a capacitor is charged with a charging current during the on-time period in the previous cycle and discharged with a discharging current during the masking time period; the discharging current being a multiple of the charging current.

18. A rectifier device comprising:
a plurality of transistor cells integrated in a semiconductor substrate; the transistor cells connecting a reference terminal and a substrate terminal of the rectifier device;
a first transistor being composed of transistor cells included in the plurality of transistor cells;
a diode connecting the reference terminal and the substrate terminal of the rectifier device;
a control circuit that is configured to switch on the first transistor for an on-time period, during which the diode is forward biased; and
only two external terminals, wherein a first external terminal of the only two external terminals comprises the reference terminal, and wherein a second external terminal of the only two external terminals comprises the substrate terminal.

19. The rectifier device according to claim 18, wherein the plurality of transistor cells are arranged in a well region formed in the semiconductor substrate, the well region and the adjoining semiconductor substrate forming a pn-junction of the diode.

20. The rectifier device according to claim 18, wherein the electric potential at the reference terminal serves as ground potential for the rectifier device so that an alternating input voltage operably applied between the substrate terminal and the reference terminal determines a substrate voltage in the semiconductor substrate.

21. The rectifier device according to claim 20, wherein the control circuit is configured to determine a begin of the on-time period by detecting a first time instant, on which the substrate voltage falls below a first threshold voltage.

22. The rectifier device according to claim 21, wherein the control circuit is configured to determine an end of the on-time period by detecting a second time instant, when the substrate voltage reaches a second threshold voltage.

23. The rectifier device according to claim 22, wherein the second threshold voltage is closer to zero than the first threshold.

24. The rectifier device according to claim 22, wherein the control circuit is configured to mask out any detection of the second time instant for a masking time period following the first time instant.

25. The rectifier device according to claim 18, wherein an anode of the diode is connected to the reference terminal and a cathode of the diode is connected to the substrate terminal.

26. The rectifier device according to claim 18, further comprising:
at least a second transistor being composed of transistor cells included in the plurality of transistor cells.

27. The rectifier device according to claim 26,
wherein the control circuit is configured to determine a begin of the on-time period by detecting a first time instant, on which the substrate voltage falls below a first threshold voltage, and
wherein the first and the second transistor are switched on at the begin of the on-time.

28. The rectifier device according to claim 27,
wherein the control circuit is configured to determine a second time instant, at which the substrate voltage exceeds a second threshold voltage, a switch-off of the first transistor being triggered at the second time instant; and
wherein the control circuit is configured to determine—after the second time instant—a third time instant, at which the substrate voltage exceeds a third threshold voltage, a switch-off of the second transistor being triggered at the third time instant.

29. The rectifier device according to claim 20,
wherein the control circuit comprises a comparator that receives, at a first input, a first input signal that represents the substrate voltage and receives, at a second input, a second input signal that represents a first threshold voltage, and
wherein an output of the comparator signaling a first time instant, at which the substrate voltage falls below the first threshold voltage.

30. The rectifier device according to claim 29,
wherein the first input signal is a scaled and/or level-shifted version of the substrate voltage,
wherein the second input signal is a correspondingly scaled and/or level-shifted version of the first threshold voltage, and
wherein the scaling and/or level-shifting is designed such that the second input signal has a positive voltage value.

31. The rectifier device according to claim 29,
wherein the control circuit further comprises a first flip-flop, which is coupled to the comparator output.

32. The rectifier device according to claim 31, wherein the first transistor is switched on and off in accordance with the state of the first flip-flop.

33. The rectifier device according to claim 32, wherein the comparator is coupled to the first flip-flop via a one-shot monoflop, which is configured to generate, when triggered by the comparator, only a single pulse before being reset by a reset signal.

34. The rectifier device according to claim 32, further comprising:
a timer circuit configured to mask out a reset of the first flip-flop for a masking time period.

35. The rectifier device according to claim 20, wherein the control circuit comprises:
a supply circuit that is configured to generate an internal supply voltage for the control circuit based on the substrate voltage, the supply circuit comprising a buffer capacitor.

36. A method for operating a rectifier device that comprises a MOS transistor and a diode coupled in parallel between an anode terminal and a cathode terminal; the method comprising:
detecting that the diode is forward biased;
switching on, by a control circuit, the MOS transistor upon detection that the diode is forward biased;
detecting, while the diode is forward biased, that the voltage across the rectifier device between the cathode terminal and the anode terminal reaches a specific threshold voltage, wherein the rectifier device comprises only two external terminals including the anode terminal and the cathode terminal; and
switching off the MOS transistor upon detection that the voltage across the rectifier device has reached the specific threshold value.

37. The method according to claim 36, further comprising:
generating an internal supply voltage for the control circuit, based on the voltage across the rectifier device between the cathode terminal and the anode terminal,
wherein the electric potential at the anode terminal is used as ground potential.

38. The method according to claim 36, wherein the rectifier device comprises a further MOS transistor coupled parallel to the diode between the anode terminal and the cathode terminal; the method further comprising:
switching on, by a control circuit, the further MOS transistor upon detection that the diode is forward biased;
detecting, after the MOS transistor has been switched off, that the voltage across the rectifier device between the cathode terminal and the anode terminal reaches a specific further threshold voltage; and
switching off the further MOS transistor upon detection that the voltage across the rectifier device has reached the specific further threshold value.

* * * * *